(12) United States Patent
Kobayashi et al.

(10) Patent No.: US 8,080,435 B2
(45) Date of Patent: Dec. 20, 2011

(54) ORGANIC ELECTROLUMINESCENCE ELEMENT AND MANUFACTURING METHOD THEREOF

(75) Inventors: Yoshihiro Kobayashi, Tokyo-to (JP); Toshihiko Takeda, Tokyo-to (JP); Shigeru Morito, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 345 days.

(21) Appl. No.: 12/545,993

(22) Filed: Aug. 24, 2009

(65) Prior Publication Data
US 2010/0051992 A1    Mar. 4, 2010

(30) Foreign Application Priority Data
Aug. 26, 2008    (JP) .................................. 2008-216665

(51) Int. Cl.
*H01L 21/00* (2006.01)
(52) U.S. Cl. .............................. 438/26; 257/40; 257/100
(58) Field of Classification Search .................... 438/26; 257/40, 100; 313/504, 506
See application file for complete search history.

(56) References Cited

U.S. PATENT DOCUMENTS

| | | | | |
|---|---|---|---|---|
| 7,538,485 B2* | 5/2009 | Murayama | ..................... | 313/504 |
| 7,710,029 B2* | 5/2010 | Yoshida et al. | ............... | 313/506 |
| 7,728,513 B2* | 6/2010 | Seo et al. | ........................ | 313/504 |
| 7,781,963 B2* | 8/2010 | Yoshida et al. | ............... | 313/506 |
| 8,004,183 B2* | 8/2011 | Seo et al. | ....................... | 313/504 |
| 2005/0019483 A1* | 1/2005 | Kawase et al. | .................. | 427/66 |
| 2006/0262393 A1* | 11/2006 | Toyoda | .......................... | 359/456 |
| 2007/0109606 A1* | 5/2007 | Nagae | ........................... | 358/3.26 |
| 2009/0284135 A1* | 11/2009 | Yoshida et al. | ................ | 313/504 |
| 2010/0230669 A1* | 9/2010 | Seo et al. | .......................... | 257/40 |
| 2010/0252857 A1* | 10/2010 | Nakatani et al. | ............... | 257/100 |

FOREIGN PATENT DOCUMENTS

JP    10-321372 A    12/1998
JP    2000-235894 A    8/2000

* cited by examiner

*Primary Examiner* — Fernando L Toledo
(74) *Attorney, Agent, or Firm* — Ladas & Parry LLP

(57) ABSTRACT

A main object of the present invention is to provide an organic EL element which can absolutely segment cathodes when forming an organic layer by a coating method, and a producing method thereof. The present invention attains the object by providing a producing method of an organic EL element comprising steps of: an organic layer forming step, in which at least one organic layer out of organic layers, including a light emitting layer, constituting an organic EL layer is formed by either of a printing method, a discharge method, or a transfer method on a substrate for an organic EL element, wherein the substrate for an organic electroluminescence element comprises a substrate, a first electrode layer formed on the substrate, plural insulating banks formed on the substrate on which the first electrode layer is formed and setting a segmentalized region which segments a second electrode layer into plural pieces, and wherein each of the banks has plural small banks provided in parallel with a predetermined gap; and a step of controlling a gap between the small banks such that, a height $t_1$ of an end part of the organic layer at a side of a light emitting region of the small bank provided on the light emitting region side is higher than a height $t_2$ of an end part of the organic layer at a side opposite to the side of the light emitting region of the small bank provided on the light emitting region side is.

8 Claims, 8 Drawing Sheets

ORGANIC ELECTROLUMINESCENCE ELEMENT AND MANUFACTURING METHOD THEREOF

FIELD OF THE INVENTION

The present invention relates to an organic electroluminescence element having a cathode bank and to a producing method thereof.

DESCRIPTION OF THE RELATED ART

Conventionally, a method of segmenting cathodes by providing an insulating bank having an inverse tapered shape (inverted trapezoid shape) on an anode and subsequently film-forming thereon an organic layer and a cathode in this order by a deposition method has been known as a producing method of an organic electroluminescence (hereinafter, may abbreviated to EL) element.

However, in case of the banks have a partial deficit or in case of dusts or particles (fine particles) are attached to the periphery of banks, there is a problem caused. When a cathode is formed by a deposition method in such cases, cathodes adjacent to each other with a bank interposed therebetween become connected over the bank so that short-out is caused between cathodes, which should be electrically-insulated.

In view of this, method of absolutely segmenting cathodes, which need to be electrically-insulated, by lining-up plural banks between cathodes have been proposed (Japanese Patent Application Laid-Open (JP-A) No. 10-321372 and JP-A No. 2000-235894).

SUMMARY OF THE INVENTION

Problem to be Solved by the Invention

In the above-mentioned method of providing a bank to segment cathodes, when an organic layer is formed by a coating method but not a deposition method, the ink used is sometimes adhered to the side surface of the bank so that the thickness of the organic layer becomes thicker around the bank. In such cases, there is a risk that the segmentation of cathodes may become impossible to segment because the thickness of the organic layer becomes thicker around the bank.

The present invention is attained in view of the above-mentioned problem, and a main object thereof is to provide an organic EL element which can absolutely segment cathodes by a bank when an organic layer is formed by a coating method, and a producing method thereof.

Means for Solving the Problems

To attain the object, the present invention provides a producing method of an organic EL element comprising steps of: an organic layer forming step, in which at least one organic layer out of organic layers, including a light emitting layer, constituting an organic EL layer is formed by either of a printing method, a discharge method, or a transfer method on a substrate for an organic EL element, wherein the substrate for an organic EL element comprises a substrate, a first electrode layer formed on the substrate, plural insulating banks formed on the substrate on which the first electrode layer is formed and setting a segmentalized region which segments a second electrode layer into plural pieces, and wherein each of the banks has plural small banks provided in parallel with a predetermined gap; and a step of controlling a gap between the small banks to establish a relation of $t_1 > t_2$, when a height of an end part of the organic layer at a side of a light emitting region of the small bank provided on the light emitting region side is $t_1$, and a height of an end part of the organic layer at a side opposite to the side of the light emitting region of the small bank provided on the light emitting region side is $t_2$, out of the small banks constituting the banks.

In the present invention, each of the banks has plural small banks provided in parallel with the predetermined gap, the gap between the small banks is controlled to establish the relation of $t_1 > t_2$, and the organic EL layer is formed by either of a printing method, a discharge method, or a transfer method. Thus, even if an organic layer forming-coating solution is adhered to the side surface of the light emitting region side of the small bank and the thickness of the organic layer becomes thicker around the bank, it is possible to prevent the organic layer forming-coating solution from getting in between the small banks. Therefore, it is possible to absolutely segment second electrode layers and to prevent short-out between second electrode layers provided with a bank inbetween.

Further, the present invention preferably comprises a second electrode layer forming step subsequent to the organic layer forming step, wherein the second electrode layer is formed on the organic EL layer by film-forming a metal material. The material for the second electrode layer is not limited as long as it has low resistance and a metal material is most suited therefore.

At this time, the film-forming method of the metal material may be a vacuum deposition method. This is because, vacuum deposition method is a dry process which has small damage to the organic EL layer and therefore, suitable for lamination.

Further, a metal paste may be used as the metal material. This is because, the wet process is more suitable for coating a big area comparing to the dry process. Even if the method is a wet process, a metal paste can be used as long as the metal paste has a solvent blended which does not affect an organic EL layer.

In addition, the present invention provides an organic EL element comprising: a substrate, a first electrode layer formed on the substrate, plural insulating banks formed on the substrate on which the first electrode layer is formed and setting a segmentalized region which segments a second electrode layer into plural pieces, an organic EL layer formed on the first electrode layer between the banks and including a light emitting layer, and a second electrode layer formed on the organic EL layer and segmentalized by the banks, wherein each of the banks has plural small banks provided in parallel with a predetermined gap; wherein a relation of $t_3 > t_4$ is established, when a height of an end part of the second electrode layer at a side of a light emitting region of the small bank provided on the light emitting region side is $t_3$, and a height of an end part of the second electrode layer at a side opposite to the side of the light emitting region of the small bank provided on the light emitting region side is $t_4$, out of the small banks constituting the banks; and wherein the adjacent second electrode layers sandwiching the bank are electrically-insulated to each other.

In the present invention, each of the banks has plural small banks provided in parallel with a predetermined gap and the relation of $t_3 > t_4$ is established. Thus, even if the coating solution is adhered to the side surface of the light emitting region side of the small banks and the thickness of the organic layer becomes thicker around the bank, it is possible to reduce the thickness of the organic layer located between the small banks and to reduce the height of the second electrode layer located between the small banks. Therefore, it is possible to absolutely segment the second electrode layer and to prevent short-out between second electrode layers provided with a bank inbetween.

In the above-mentioned invention, an insulating layer is preferably formed between the first electrode layer and the bank. Thereby, it is possible to prevent short-out caused by the first electrode layer contacting to the second electrode layer.

Further, in the present invention, at least one organic layer out of organic layers constituting the organic EL layer may have a meniscus cross-sectional shape. When an organic layer constituting the organic EL layer has a meniscus cross-sectional shape, the thickness of the organic layer becomes thicker around the bank. However, by the technical structure of the present invention, it becomes possible to absolutely segment the second electrode layers.

Effects of the Invention

In the present invention, since each of the banks has plural small banks provided in parallel with the predetermined gap, it is possible to attain the effects of: preventing the organic layer forming-coating solution from getting in between the small banks, absolutely segmenting second electrode layers, and preventing short-out between second electrode layers provided with a bank inbetween.

DESCRIPTION OF THE PREFERRED EMBODIMENT

Hereinafter, an organic EL element and a producing method thereof for the present invention will be explained in detail.

A. Producing Method of Organic EL Element

First, a producing method of an organic EL element will be explained.

The producing method of an organic EL element of the present invention comprises steps of: an organic layer forming step, in which at least one organic layer out of organic layers, including a light emitting layer, constituting an organic EL layer is formed by either of a printing method, a discharge method, or a transfer method on a substrate for an organic EL element, wherein the substrate for an organic EL element comprises a substrate, a first electrode layer formed on the substrate, plural insulating banks formed on the substrate on which the first electrode layer is formed and setting a segmentalized region which segments a second electrode layer into plural pieces, and wherein each of the banks has plural small banks provided in parallel with a predetermined gap; and a step of controlling a gap between the small banks to establish a relation of $t_1 > t_2$, when a height of an end part of the organic layer at a side of a light emitting region of the small bank provided on the light emitting region side is $t_1$, and a height of an end part of the organic layer at a side opposite to the side of the light emitting region of the small bank provided on the light emitting region side is $t_2$, out of the small banks constituting the banks.

The producing method of an organic EL element of the present invention will be explained with reference to the drawings.

Figure 1:
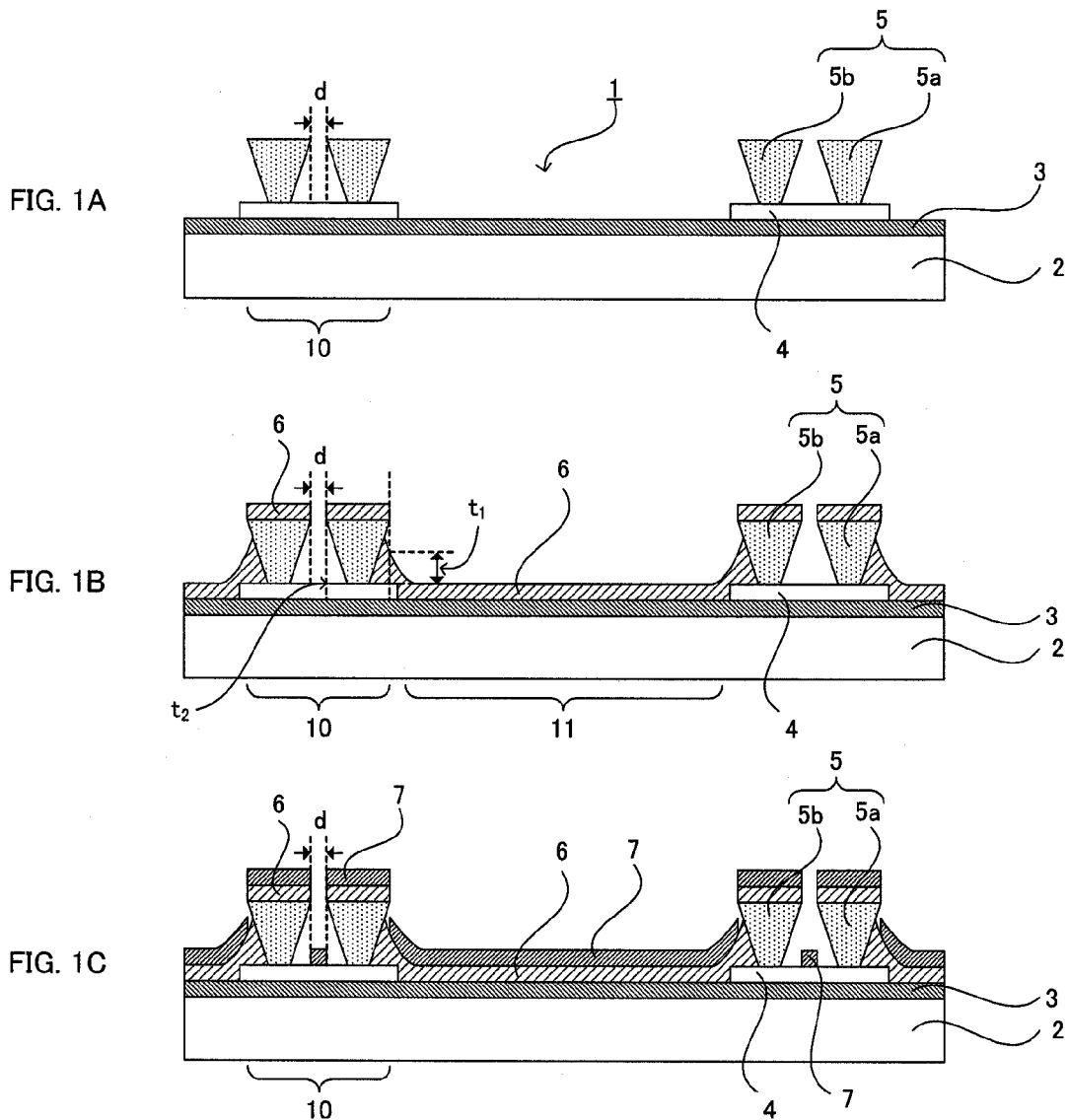
FIGS. 1A to 1C are a process chart illustrating an embodiment of the producing method of an organic EL element of the present invention.
Figure 2:
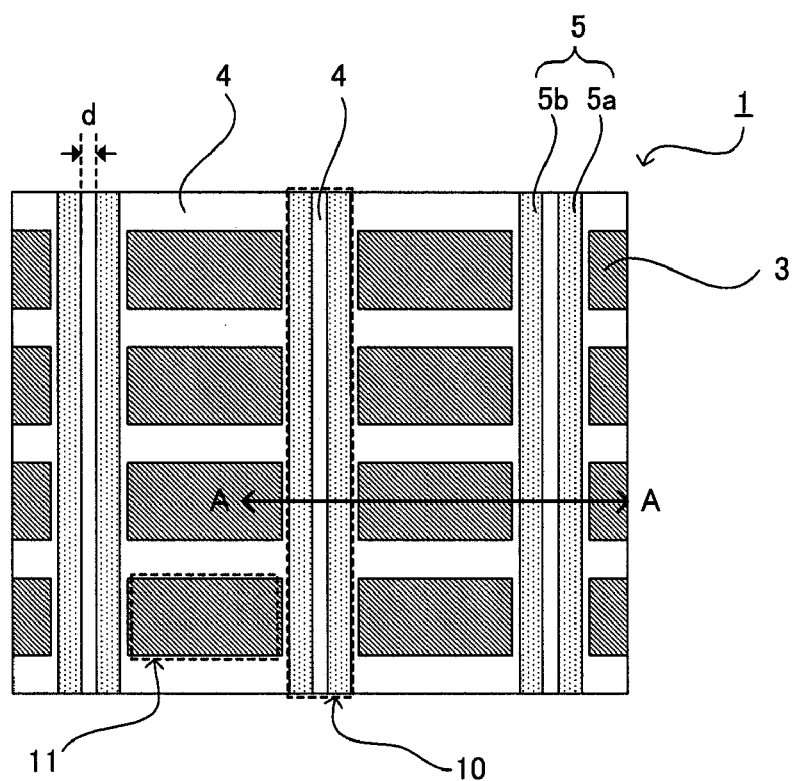
FIG. 2 is a schematic view illustrating an embodiment of the substrate for an organic EL element used in the present invention.

FIGS. 1A to 1C are a process chart illustrating an embodiment of the Producing method of an organic EL element of the present invention. First, prepared is a substrate for an organic EL element 1 which comprising: a substrate 2, a first electrode layer 3 formed on the substrate 2, an insulating layer 4 formed on the first electrode layer 3, and plural insulating banks 5 formed on the insulating layer 4 and which set a segmentalized region 10 which segments a second electrode layer into plural pieces (FIG. 1A, substrate for an organic EL element preparing step). In the substrate for an organic EL element 1, each of the banks 5 has plural small banks 5a and 5b provided in parallel with a predetermined gap "d". The gap "d" between the small banks 5a and 5b is adjusted to establish a relation of $t_1 > t_2$, when a height of an end part of the organic layer 6 at a side of a light emitting region 11 of the small bank 5a is $t_1$, and a height of an end part of the organic layer 6 at a side opposite to the side of the light emitting region 11 of the small bank is $t_2$, regarding the organic layer formed in the organic layer forming step to be explained later. Further, in an embodiment shown in FIG. 1A, as shown in FIG. 2, banks 5 (small banks 5a and 5b) are formed such that the striped pattern of the first electrode layer 3 becomes orthogonal to the striped pattern of the banks 5 (small banks 5a and 5b). FIG. 1A is a cross-sectional view of the A-A cross-section line shown in FIG. 2.

Next, an organic layer 6 is formed by a printing method, a discharge method, or a transfer method on the entire surface of the substrate for an organic EL element 1, for example by coating an organic layer forming-coating solution by a gravure printing method (FIG. 1B, organic layer forming step).

In an embodiment shown in FIG. 1B, a light emitting layer is formed as the organic layer 6. The organic layer 6 is formed to establish the relation of $t_1 > t_2$. In the embodiment shown in FIG. 1B, an organic layer forming-coating solution is adhered to the side surface of the light emitting region 11 side of the respective small banks 5a and 5b and the thickness of the organic layer 6 becomes thick around the bank 5. Further, since the gap "d" between the small banks 5a and 5b is relatively narrow, the organic layer forming-coating solution is less likely to get in between the small banks 5a and 5b. Thereby, the relation $t_1 > t_2$ is established. In FIG. 1B, $t_2 = 0$.

The reason why the organic layer forming-coating solution is less likely to get in between small banks, in case a printing method, a discharge method, or a transfer method is used and when the gap between small banks is relatively narrow, is not clear. However, it is thought as follows. In a printing method, since the gap between small banks is relatively narrow, the master or a blanket cannot contact to the first electrode layer surface between the small banks so that the organic layer forming-coating solution becomes less likely to get in between small banks. In a transfer method, similar to the case of the printing method, since the gap between small banks is relatively narrow, a transfer sheet cannot contact to the first electrode layer surface between the small banks so that the organic layer forming-coating solution becomes less likely to get in between small banks. In a discharge method, by not discharging the organic layer forming-coating solution onto the first electrode layer between small banks, it is possible to make the organic layer forming-coating solution less likely to get in between small banks.

Subsequently, on the organic layer 6, a material such as a metal material is formed by the vacuum deposition method, and thereby a second electrode layer 7 is formed (FIG. 1C, second electrode layer forming step). Since the metal material is also accumulated between the small banks 5a and 5b, the second electrode layer 7 is also formed between the small banks 5a and 5b. This second electrode layer 7 is segmented by the bank 5 (small banks 5a and 5b).

In the present invention, each of the banks has plural small banks provided in parallel with the predetermined gap, the gap between the small banks is controlled to establish the relation of $t_1 > t_2$, and the organic EL layer is formed by either of a printing method, a discharge method, or a transfer method. Thus, even if an organic layer forming-coating solution is adhered to the side surface of the light emitting region side of the small bank and the thickness of the organic layer becomes thicker around the bank, it is possible to prevent the organic layer forming-coating solution from getting in between the small banks. Therefore, it is possible to absolutely segment second electrode layers and to prevent short-out between second electrode layers provided with a bank inbetween.

The expression "segmentalized region" denotes a region segments a second electrode layer into plural pieces and is a region not contributing to the light emission. This segmentalized region is a region where the bank is provided and is set by the bank.

The expression "light emitting region" denotes a region contributing to the light emission.

Figure 3:
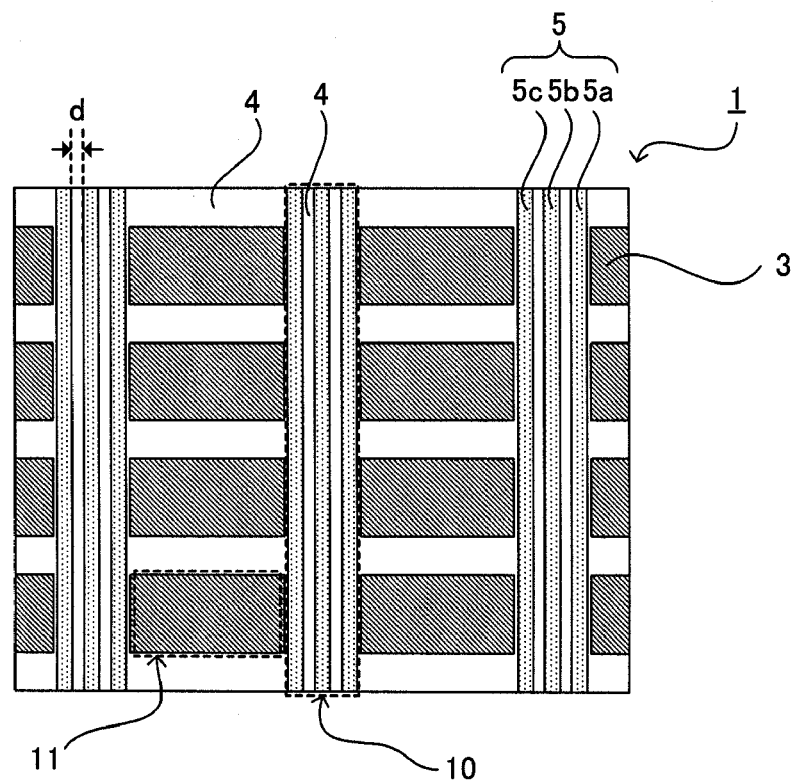
FIG. 3 is a schematic view illustrating other embodiment of the substrate for an organic EL element used in the present invention.

The expression "small bank provided on the light emitting region side . . . out of small banks constituting the banks" denotes two small banks provided on both ends of the bank out of plural small banks constituting the bank. As shown in FIG. 2, when the bank 5 is made of two small banks of 5a and 5b, both of the two small banks 5a and 5b are the small banks provided on both ends of the bank 5. Further, as shown in FIG. 3, when the bank 5 is made of three small banks of small banks 5a, 5b, and 5c, the two small banks provided on both ends of the bank 5 becomes the small banks 5a and 5c out of the three small banks of 5a, 5b, and 5c.

The expression "end part . . . at a side of the light emitting region of the small bank provided on the light emitting region side" denotes an end part provided on the light emitting region side out of the end parts of small banks provided on the light emitting region side.

Further, the "end part . . . at a side opposite to the side of the light emitting region of the small bank provided on the light emitting region side" denotes an end part provided at the opposite side to the light emitting region side out of the end parts of small banks provided on the light emitting region side.

The expression "height of an end part of the organic layer at the side of a light emitting region of the small bank provided on the light emitting region side is $t_1$" denotes the height of the small bank from the under layer surface to the organic layer surface, at the the light emitting region side end part of the small bank which is provided to the light emitting region side. As shown in FIG. 1B, when the small banks 5a and 5b are formed directly on the insulating layer 4, the under layer of the small banks 5a and 5b is the insulating layer 4, and the height $t_1$ of the organic layer is a height from the insulating layer 4 surface to the organic layer 6 surface at the end part of the light emitting region 11 side of the small bank 5a. Further, as shown in FIG. 4B, when the small banks 5a and 5b are directly formed on the first electrode layer 3, the under layer of the small banks 5a and 5b is the first electrode layer 3, and the height $t_1$ of the organic layer is a height from the first electrode layer 3 surface to the organic layer 6 surface at the end part of the light emitting region 11 side of the small bank 5a. In other words, the height $t_1$ of the organic layer denotes the height (thickness) of the organic layer only at the end part of the light emitting region side of the small bank.

Figure 4A:
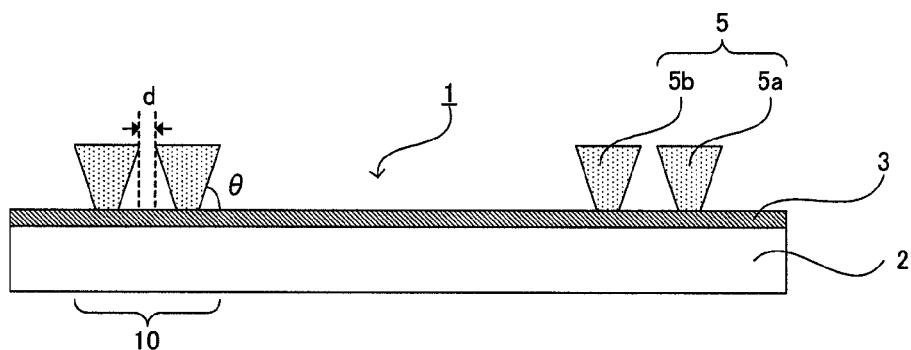
FIGS. 4A to 4C are a process chart illustrating other embodiment of the producing method of an organic EL element of the present invention.
Figure 4B:
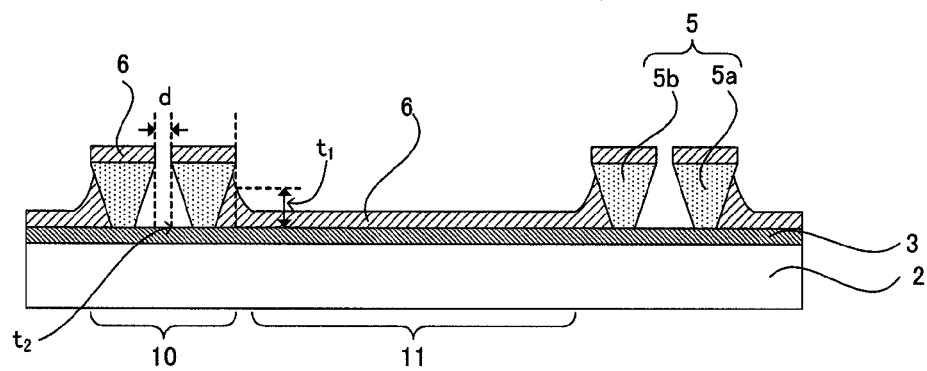
Figure 4C:
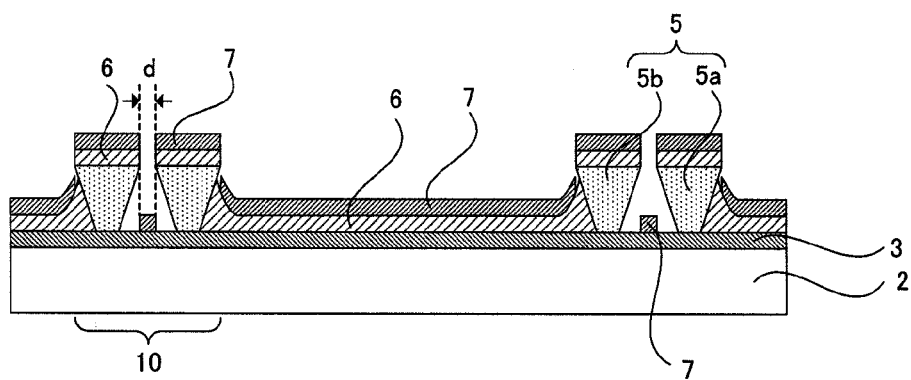

FIGS. 4A to 4C are a process chart illustrating another embodiment of the producing method of an organic EL element of the present invention.

Further, the expression "height of an end part of the organic layer at a side opposite to the side of the light emitting region of the small bank provided on the light emitting region side is $t_2$" denotes a height of the small bank from the under layer surface to the organic layer surface at the end part of the small bank, provided on the light emitting region, and the end part is located at a side opposite to the light emitting region side. As shown in FIG. 1B, when the small banks 5a and 5b are formed directly on the insulating layer 4, the under layer of the small banks 5a and 5b is the insulating layer 4, the height $t_2$ of the organic layer is the height of the end part of the small bank 5a which is opposite to the light emitting region 11 side, and the height $t_2$ is the height from the insulating layer 4 surface to the organic layer 6 surface. Still further, as shown in FIG. 4B, when the small banks 5a and 5b are formed directly on the first electrode layer 3, the under layer of the small banks 5a and 5b is the first electrode layer 3, the height $t_2$ of the organic layer is the height of the end part of the small bank 5a which is opposite to the light emitting region 11 side, and the height $t_2$ is the height from the first electrode layer 3 surface to the organic layer 6 surface. In other words, the height $t_2$ of the organic layer denotes the height (thickness) of the organic layer only at the end part of the small bank which is opposite to the light emitting region side.

The respective height of the organic layer $t_1$ and $t_2$ can be measured by the Scanning White Light Interferometry of Zygo Corporation or using a laser microscope manufactured by KEYENCE CORPORATION.

The expression "gap between small banks" denotes a distance between an end part of one small bank to an end part of the adjacent small bank out of plural small banks constituting a bank.

The gap between small bank can be measured by an optical microscope, a laser microscope, or the Scanning White Light Interferometry.

The producing method of an organic EL element of the present invention is sufficient as long as it comprises the above-mentioned organic layer forming step, but may also comprises the followings for example: prior to the organic layer forming step, a substrate for an organic EL element preparing step wherein the substrate for an organic EL element is prepared; the organic layer forming step and an organic EL layer forming step wherein an organic EL layer is formed; or after the organic EL layer forming step, a second electrode layer forming step wherein a second electrode layer is formed on the organic EL layer.

Hereinafter, each step of the producing method of an organic EL element of the present invention will be explained.

1. Substrate for Organic EL Element Preparing Step

A substrate for an organic EL element preparing step of the present invention is a step of preparing a substrate for an organic EL element which comprises a substrate, a first electrode layer formed on the substrate, plural insulating banks formed on the substrate on which the first electrode layer is formed and setting a segmentalized region which segments a second electrode layer into plural pieces, wherein each of the banks has plural small banks provided in parallel with a predetermined gap. In the present step, regarding an organic layer formed in the organic layer forming step to be explained later, the gap between small banks is controlled to establish a relation of $t_1 > t_2$, when a height of an end part of the organic layer at a side of a light emitting region of the small bank provided on the light emitting region side is $t_1$, and a height of an end part of the organic layer at a side opposite to the side of the light emitting region of the small bank provided on the light emitting region side is $t_2$, out of the small banks constituting the banks.

Hereinafter, each technical structure of the substrate for an organic EL element will be explained.

(1) Bank

In the present invention, banks are formed by plural numbers on the substrate where the first electrode layer is formed thereon, and the banks set a segmentalized region which segments a second electrode layer into plural pieces. Each of the banks has plural small banks provided in parallel with a predetermined gap. The gap between small banks is controlled to establish the relation of $t_1 > t_2$, when a height of an end part of the organic layer at a side of a light emitting region of the small bank provided on the light emitting region side is $t_1$, and a height of an end part of the organic layer at a side opposite to the side of the light emitting region of the small bank provided on the light emitting region side is $t_2$, out of the small banks constituting the banks, regarding the organic layer formed in the organic layer forming step to be explained later.

The gap between small banks is sufficient as long as it establishes the relation of $t_1 > t_2$, and is to be appropriately controlled according to a coating method used in forming an organic layer. Specifically, the gap is preferably 100 μm or smaller, more preferably within the range of 60 μm to 1 μm, and even more preferably within the range of 30 μm to 1 μm. When the gap between small banks is too wide, the organic layer forming-coating solution easily gets in between small banks and raises the risk of having difficulty in segmenting the second electrode layer. When the gap between small banks is too narrow, formation of the gap may become difficult or there is a risk of having organic layers continuously formed between gaps.

The measuring method of the gap between small banks is as explained above.

Generally, the gap between small banks is in equal interval when the number of small banks constituting the bank is three or more.

The number of the small banks constituting the bank is not limited as long as it is plural, and may be made such as two or three. When the number of the small banks constituting the bank is too many, the light emitting region becomes relatively narrow. Thus, the number of the small banks constituting the bank is preferably two.

As long as the small banks have the predetermined height, it is possible to segment the second electrode layer into plural pieces. Thus, the cross-section of the small banks is not particularly limited and for example, a rectangle shape, a trapezoid shape (forward tapered shape), and an inverse tapered shape may be cited. A preferable shape is an overhang shape such as the inverse tapered shape.

When the small banks have the inverse tapered shape, a taper angle θ to the substrate surface is sufficiently 0°<θ<90°, preferably 20°<θ<80°, and more preferably 30°<θ<70°. When the small banks have the inverse tapered shape, the taper angle θ denotes a taper angle θ to the substrate 2 surface as shown in FIG. 4A.

Here, an end part of the small bank denotes the outer most end part of the small bank. For example, when the cross-section shape of the small bank is an inverse tapered shape, the end part of the small bank is an end part of the upper base surface as shown in FIG. 1B and FIG. 4B. Further for example, when the cross-section shape of the small bank is a forward tapered shape, the end part of the small bank is an end part of the lower base surface as shown in FIG. 5.

In other words, for example, when the cross-section shape of the small bank is the inverse tapered shape, the height $t_1$ of the organic layer at the end part of the light emitting region side of the small bank provided on the light emitting region side is, as shown in FIG. 1B and FIG. 4B, the height $t_1$ of the organic layer at the end part of the light emitting region 11 side upper base surface of the small bank 5a. Further, the height $t_2$ of the organic layer at the side opposite to the light emitting region side of the small bank provided on the light emitting region side is, as shown in FIG. 1B and FIG. 4B, the height $t_2$ of the organic layer at the end part of the upper base surface opposite to the light emitting region 11 of the small bank 5a.

Figure 5:
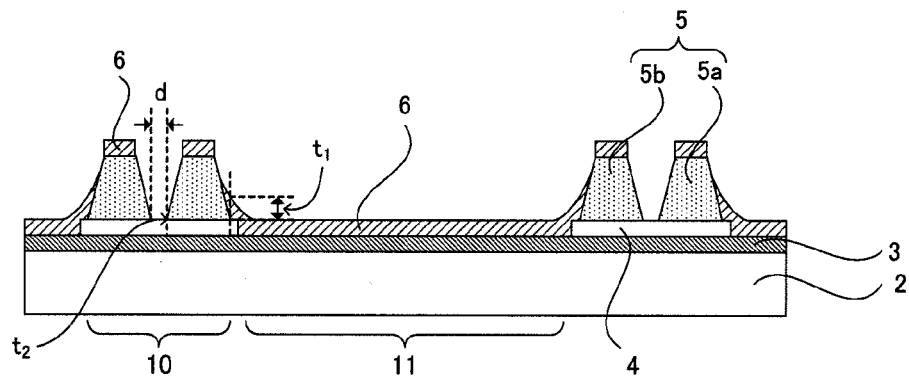
FIG. 5 is a schematic view illustrating one embodiment of the organic layer forming step of the producing method of an organic EL element for the present invention.

Moreover, when the cross-section shape of the small bank is the forward tapered shape, the height $t_1$ of the organic layer at the end part of the light emitting region side of the small bank provided on the light emitting region side is, as shown in FIG. 5, the height $t_1$ of the organic layer at the end part of the light emitting region 11 side lower base surface of the small bank 5a. Further, the height $t_2$ of the organic layer at the side opposite to the light emitting region side of the small bank provided on the light emitting region side is, as shown in FIG. 5, the height $t_2$ of the organic layer at the end part of the lower base surface opposite to the light emitting region 11 of the small bank 5a.

As a height of the small banks, the height from the substrate surface to the small banks surface is generally set to be higher than the height from the substrate surface to the second electrode layer surface at the center part of the light emitting region.

A forming position of the bank is appropriately selected according to factors such as a driving method and a display method of the organic EL element. For example, in a passive-type organic EL element, a first electrode layer is generally formed in a striped pattern. Accordingly, small banks constituting a bank are also formed in such striped pattern that their striped pattern becomes orthogonal to the striped pattern of the first electrode layer. Further, in case of an area color organic EL element wherein the first electrode layer is formed almost entire surface of the substrate except the region where a take-out electrode or the like is formed and the light emitting region is segmented into the desired pattern by the bank, the small banks constituting the bank are formed into the desired pattern such as a picture and character pattern.

The plural small banks constituting the bank are sufficient as long as they are provided in parallel with the predetermined gap. The form of the small banks may be in line or curve.

A width of the segmentalized region set by the bank is not particularly limited, however, it is preferably 300 μm or smaller. When the width of the segmentalized region is within the above-mentioned range, it is possible to fully secure the effect of preventing the organic layer forming-coating solution from getting in the segmentalized region. Further, when the width of the segmentalized region is too wide, the light emitting region becomes relatively narrow.

As examples of a forming material of the bank, a photoactive polyimide resin, a photo curable resin or a thermosetting resin such as an acrylic-based resin, a novolac-based resin, a styrene-based resin, a phenol-based resin, and a melamine-based resin, and an inorganic material can be cited.

In this case, a general method to form the bank such as a photolithographic method and a printing method can be used.

(2) First Electrode Layer

A first electrode layer used in the present invention may be an anode or a cathode, but normally formed as an anode.

The first electrode layer may be or may not be transparent. Transparency of the first electrode layer is appropriately selected depending on factors such as a light-taking out surface. For example, when the light is taken out from the first electrode layer side, the first electrode layer needs to be transparent of translucent.

As an anode, a conductive material which has a large work function which allows an easy injection of holes is preferable. Specifically, ITO, indium oxides a metal having a large work function such as gold, and a conductive polymer such as polyaniline, polyacetylene, polyalkylthiophene derivatives, and polysilane derivatives can be cited.

The first electrode layer preferably has small resistance and a metal material is generally used, but an organic compound and an inorganic compound may also be used.

The first electrode layer may be formed on the substrate in pattern, or may be formed on almost the entire surface of the substrate excluding the region where a take-put electrode or the like is formed. Generally, the first electrode layer is formed in pattern on the substrate. When the first electrode layer is formed on almost the entire surface of the substrate excluding the region where a take-put electrode or the like is formed, the light emitting region can be segmented into the desired pattern by the bank.

As a film-forming method of the first electrode layer, a general method can be used. For example, a deposition method, a sputtering method, a PVD method such as an ion-plating method, and a CVD method can be cited. Further, a patterning method of the first electrode layer is not particularly limited as long as it can be formed into the desired pattern precisely. Specifically, a method such as a photolithographic method can be cited.

(3) Substrate

The substrate used in the present invention is to support members such as the above-mentioned bank and first electrode layer, and is not particularly limited as long as it has the predetermined strength. In the present invention, when the first electrode layer has the predetermined strength, the first electrode layer may also function as the substrate, but in general, the first electrode layer is formed on the substrate which has the predetermined strength.

The substrate is not particularly limited as long as members such as the above-mentioned bank and first electrode layer can be formed. For example, the need of optical transparency is appropriately decided depending on the light taking-put surface. In general, it is preferable to make the substrate side as the light take-out surface. Thus, the substrate is preferably made of a transparent material.

As examples of a forming material of such substrate, glass plate such as soda-lime glass, alkali glass, lead-alkali glass, borosilicate glass, aluminosilicate glass, and silica glass, and a resin substrate which can be formed into a film can be cited. A resin used for the resin substrate is preferably a polymer material which has a relatively high solvent resistance and heat-resistance. As specific examples, a fluorine-based resin, polyethylene, polypropylene, polyvinyl chloride, polyvinylfluoride, polystyrene, an ABS resin, polyamide, polyacetal, polyester, polycarbonate, modified-polyphenylene ether, polysulphone, polyarylate, polyeterimide, polyetersulphone, polyamideimide, polyimide, polyphenylenesulfide, liquid crystalline polyester, polyethylene terephthalate, polybutylene terephthalate, polyethylene naphthalate, polymicroixylenedimethylene terephthalate, polyoxymethylene, polyetersulfone, polyeter ether ketone, polyacrylate, an acrylonitrile-styrene resin, a phenol resin, a urea resin, a melamine resin, an unsaturated polyester resin, an epoxy resin, polyurethane, a silicone resin, and an amorphous polyolefin can be cited. Further, other than the above-mentioned substance, a polymer material which satisfies the predetermined conditions may be used, and a copolymer of more than two kinds may also be used. Still further, a substrate which has gas barrier properties to block a gas such as moisture and oxygen may also be used as needed.

(4) Insulating Layer

In the present invention, an insulating layer is preferably formed between the first electrode layer and the bank. Thereby, it is possible to prevent short-out caused by the first electrode layer contacting to the second electrode layer. The insulating layer is preferably formed so as to cover the end part of the first electrode layer. As a thickness of the organic layer is reduced at the end part of the first electrode layer, short-out can be made difficult to occur by forming the insulating layer. Further, the formation of the insulating layer can prevent the adjacent light emitting regions from getting electrically connected. The part with the insulating layer formed can be made to a region which does not contribute to the light emission.

As examples of a forming material of the insulating layer, a photoactive polyimide resin, a photo curable resin or a thermosetting resin such as an acrylic-based resin, and an inorganic material can be cited.

As a method of forming the insulating layer, a general method such as a photolithographic method and a printing method can be used.

2. Organic Layer Forming Step

An organic layer forming step of the present invention is a step wherein at least one organic layer out of organic layers, including a light emitting layer, constituting an organic EL layer is formed by either of a printing method, a discharge method, or a transfer method on the substrate for an organic EL element. In the present step, the organic layer is formed so as to establish the relation of $t_1 > t_2$, when the height of the end part of the organic layer at the light emitting region side of the small bank provided on the light emitting region side is $t_1$, and the height of the end part of the organic layer at a side opposite to the light emitting region side of the small bank provided on the light emitting region side is $t_2$, out of the small banks constituting the bank.

An organic EL layer used in the present invention comprises one layer or plural layers of organic layers including at least the light emitting layer. In other words, the organic EL layer is a layer including at least the light emitting layer and denotes a layer which layer structure contains at least one organic layer. Generally, in forming an organic EL layer by a wet process of coating, it is difficult to laminate many layers because of the relation to a solvent used so that the organic layer is formed by a single or two organic layers in many cases. However, by arranging an organic material used or by combining with a vacuum deposition method, it becomes possible to form an organic EL layer by many layers.

As another example of the organic layer constituting the organic EL layer than the light emitting layer, a hole injecting layer, an electron injecting layer, a hole transporting layer, and an electron transporting layer can be cited. The hole transporting layer may sometimes be integrated with the hole injecting layer by providing a hole transporting function to the hole injecting layer. The electron transporting layer may sometimes be integrated with the electron injecting layer by providing an electron transporting function to the electron injecting layer. Further, as yet another example of the organic layer constituting the organic EL layer, a layer, such as a carrier blocking layer, which prevents the penetration of holes and electrons and which improves rebinding efficiency can be cited.

In the present invention, at least one organic layer out of the organic layers constituting the organic EL layer is formed by a printing method, a discharge method, or a transfer method. As for the number of the organic layer formed by a printing method, a discharge method, or a transfer method, at least one layer is sufficient. For example, it may be one layer, two layers, or three layers.

As examples of the organic layer formed by the printing method, the discharge method, or the transfer method, a hole injecting layer, a hole transporting layer, a light emitting layer, a electron transporting layer, and an electron injecting layer can be cited. Among them, the organic layer formed by the printing method, the discharge method, or the transfer method is preferably a light emitting layer. Further, the organic layer formed by the printing method, the discharge method, or the transfer method may be a hole injecting layer and a light emitting layer.

At the time of forming the organic layer, an organic layer forming-coating solution for forming the organic layer is coated on the substrate for an organic EL element by a printing method, a discharge method, or a transfer method. For this organic layer forming-coating solution, a material according to the type of the organic layer will be used.

Hereinafter, the organic layer and the formation method of the organic layer in the present step will be explained.
(1) Organic Layer
(1) Light Emitting Layer As examples of a material for the light emitting layer, light emitting materials such as pigment base materials, metal complex based materials, and polymer based materials can be cited.

As examples of the pigment based materials, cyclopentadiene derivatives, tetraphenylbutadiene derivatives, triphenyl amine derivatives, oxadiazol derivatives, pyrazoloquinoline derivatives, distylyl benzene derivatives, distylyl arylene derivatives, silol derivatives, a thiophene ring compound, a pyridine ring compound, perynon derivatives, perylene derivatives, oligothiophene derivatives, triphmanyl amine derivatives, an oxadiazol dimer, and a pyrazoline dimer, can be presented.

As examples of the metal complex based materials, metal complexes having Al, Zn, or Be, or a rare earth metal such as Tb, Eu, or Dy as the central metal, and oxadiazol, thiadiazol, phenyl pyridine, phenyl benzoimidazol, quinoline structure, or the like as the ligand, such as a aluminum quinolinol complex, a benzoquinolinol beryllium complex, a benzoxazol zinc complex, a benzothiazol zinc complex, an azomethyl zinc complex, a porphiline zinc complex, and an europium complex can be cited.

Further, as examples of the polymer based materials, polyparaphenylene vinylene derivatives, polythiophene derivatives, polyparaphenylene derivatives, polysilane derivatives, polyacetylene derivatives, polyvinyl carbazol, polyfluolene derivatives, polyquinoxaline derivatives, and a polymer thereof can be cited.

A doping substance may be added in the light emitting layer in order to improve the light emitting efficiency, change the light emitting wavelength, and the like. As examples of such doping substance, perylene derivatives, coumalin derivatives, rubrene derivatives, quinacrydone derivatives, squalium derivatives, porphiline derivatives, a styryl based pigment, tetracene derivatives, pyrazoline derivatives, decacyclene, phenoxazone, quinoxaline derivatives, carbazol derivatives, and fluolene derivatives can be cited.

A thickness of the light emitting layer is not particularly limited as long as it is a thickness which can realize a function to provide a field for electrons and holes to rebind and to emit lights. The thickness may be, for example, about 1 nm to 500 nm.

Figure 8:
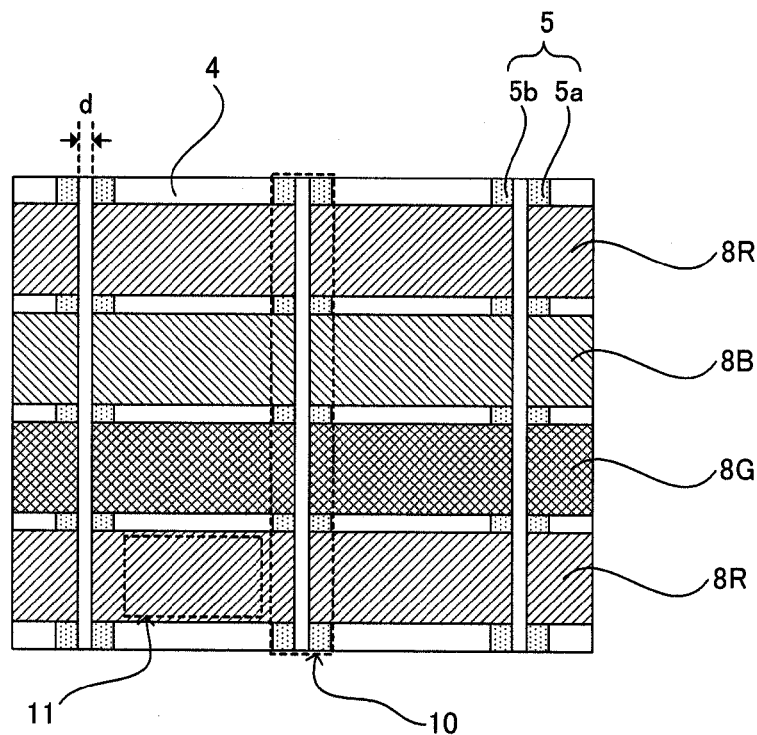
FIG. 8 is a schematic view illustrating still other embodiment of the organic layer forming step of the producing method of an organic EL element for the present invention.
Figure 9:
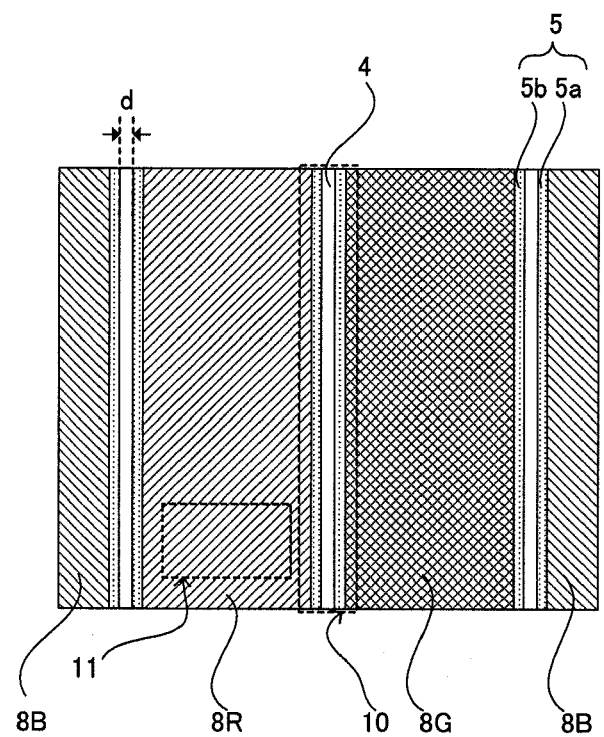
FIG. 9 is a schematic view illustrating yet other embodiment of the organic layer forming step of the producing method of an organic EL element for the present invention.

In the present invention, the light emitting layer is segmented by the bank and formed in pattern. At this time, the light emitting layer is preferably formed in pattern to have light emitting part of plural colors such as red, green, and blue. Thereby, an organic EL element which can display in color can be obtained. In this case, for example, it is possible to form the light emitting layer in pattern using the substrate for an organic EL element 1 shown in FIG. 2 and forming the layer in pattern to have a red light emitting part 8R, a green light emitting part 8G, and a blue light emitting part 8B as shown in FIGS. 8 and 9.

(ii) Hole Injecting Layer

As explained, the hole transporting layer may sometimes be integrated with the hole injecting layer by providing a hole transporting function to the hole injecting layer. In other words, the hole injecting layer may have a single function of hole injecting function, or may have both functions of a hole injecting function and a hole transporting function.

A material used for the hole injecting layer is not particularly limited as long as it is a material which can stabilize the hole injection to the light emitting layer. A part from those compounds listed as the light emitting material for the above-mentioned light emitting layer, the followings can be cited as examples: phenylamines, starburst type amines, phthalocyanins, polyaniline, polythiophene, and polyphenylenevinylene derivatives. Specifically, substances such as bis(N-(1-naphthyl-N-phenyl)-benzidine(α-NPD), 4,4,4-tris(3-methylphenylphenylamino)triphenylamine (MTDATA), poly(3,4-ethylenedioxithiophene)-polystyrene sulfonate (PEDOT-PSS), and polyvinyl carbazole (PVCz) can be cited.

Further, a thickness of the hole injecting layer is not particularly limited as long as it is a thickness which can fully realize the hole injecting function or the hole transporting function. Specifically, the thickness is preferably within the range of 0.5 nm to 1,000 nm, and in particular, within the range of 10 nm to 500 nm.

(iii) Electron Injecting Layer

As explained, the electron transporting layer may sometimes be integrated with the electron injecting layer by providing the electron transporting function to the electron injecting layer. In other words, the electron injecting layer may have a single function of the electron injecting function, or may have both functions of the electron injecting function and the electron transporting function.

A material used for the electron injecting layer is not particularly limited as long as it is a material which can stabilize the electron injection to the light emitting layer, and those compounds listed in the light emitting material for the light emitting layer may be used.

Alternatively, a metal dopes layer, in which an alkali metal or an alkali earth metal is doped in the organic material having electron transporting properties, may be formed to use as an electron injecting layer. As examples of the organic material having electron transporting properties, bathocuproin, bathophenanthroline, and phenanthroline derivatives can be cited. As examples of the metal doped, metals such as Li, Cs, Ba, and Sr can be cited.

A thickness of the electron injecting layer is not particularly limited as long as it is a thickness which can fully realize the electron injecting function or the electron transporting function.

(iv) Electron Transporting Layer

A material used for an electron transporting layer is not particularly limited as long as it is a material capable of transporting electrons injected from a cathode into the light emitting layer. For example, bathocuproin, bathophenanthroline, phenanthroline derivatives, triazole derivatives, oxadiazole derivatives, and a derivative of tris(8-quinolinolato)aluminum ($Alq_3$) can be cited.

A thickness of the electron transporting layer is not particularly limited as long as it is a thickness which can fully realize the electron transporting function.

(2) Forming Method of Organic Layer

The organic layer forming-coating solution used in the present step is prepared by dissolving or dispersing the material constituting the organic layer into a solvent. The solvent used is appropriately selected according to the material constituting the organic layer. For example, when the light emitting layer is formed as the organic layer, the solvent used for the light emitting layer forming-coating solution is not particularly limited as long as it can dissolve or disperse the above-mentioned light emitting material. For example, chloroform, methylene chloride, dichloroethane, tetrahydrofuran, toluene, xylene, tetralin, and mesitylene can be cited.

In the present step, as explained above, the organic layer forming-coating solution is coated on the substrate for an organic EL element by a printing method, a discharge method, or a transfer method. This is because, these methods are methods which make the organic layer forming-coating solution less likely to get in between small banks.

As examples of the printing method, a gravure printing method, a typographic printing, and a screen printing method can be cited. As the discharge method, an ink-jet printing method is cited. In case of using the ink-jet printing method, the organic layer forming-coating solution may be discharged in a discontinuous way or continuous way. As the transfer method, a thermal transfer method is cited.

Figure 6A:
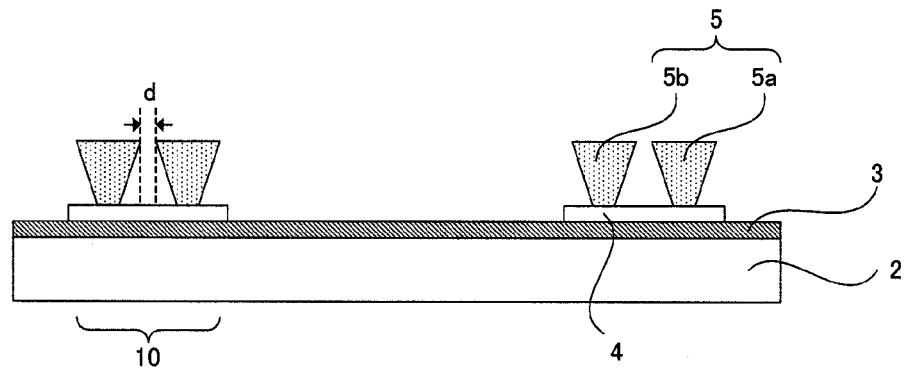
FIGS. 6A to 6C are a process chart illustrating still other embodiment of the producing method of an organic EL element of the present invention.
Figure 6B:
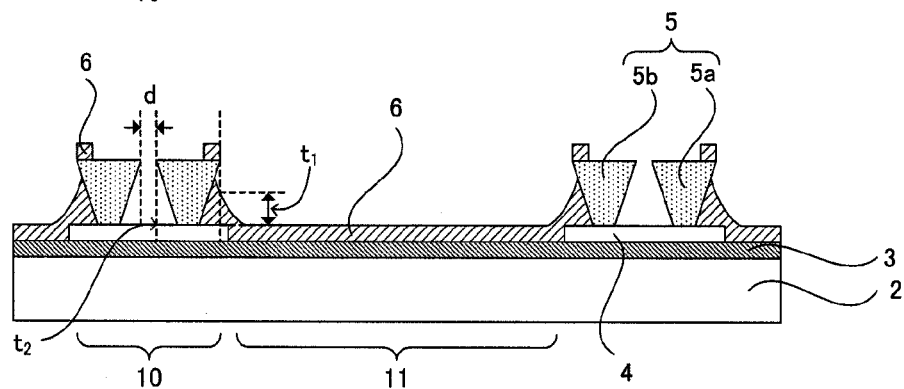
Figure 6C:
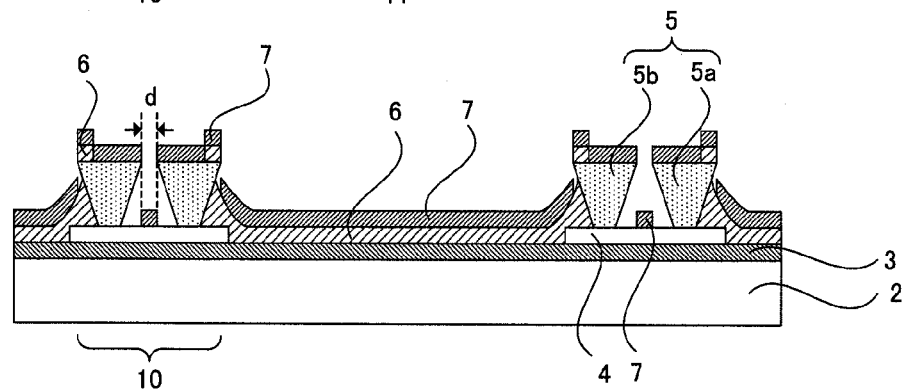

The organic layer forming-coating solution may be coated to the entire surface of the substrate for an organic EL element 1 as shown in FIG. 1B, or may be coated in pattern on the substrate for an organic EL element 1 as shown in FIG. 6B, FIG. 8 and FIG. 9. FIGS. 6A to 6C are a process chart illustrating the producing method of an organic EL element of the present invention.

Further, when the small banks (5a, 5b, and 5c) constituting the bank 5 are formed in line as shown in FIGS. 2 and 3 at the time of coating the organic layer forming-coating solution, the organic layer forming-coating solution may be coated vertically to the longitudinal direction of the small banks, or parallel to the longitudinal direction of the small banks. For example, when the light emitting layer is formed in pattern such that it has three light emitting parts of the red light emitting part 8R, green light emitting part 8G, and the blue light emitting part 8B, using the substrate for an organic EL element 1 shown in FIG. 2, each light emitting layer forming-coating solutions may be coated vertical to the longitudinal directions of the small banks 5a and 5b as shown in FIG. 8, or alternatively, each light emitting layer forming-coating solution may be coated parallel to the longitudinal directions of the small banks 5a and 5b as shown in FIG. 9.

Drying may be conducted after the organic layer forming-coating solution is coated.

In the present step, the organic layer is formed such that it establishes the relation of $t_1 > t_2$, when the height of the end part of the organic layer at the light emitting region side of the small bank provided on the light emitting region side is $t_1$, and the height of the end part of the organic layer at the opposite side to the light emitting region side of the small bank provided on the light emitting region side is $t_2$, out of the small banks constituting the banks.

Figure 7:
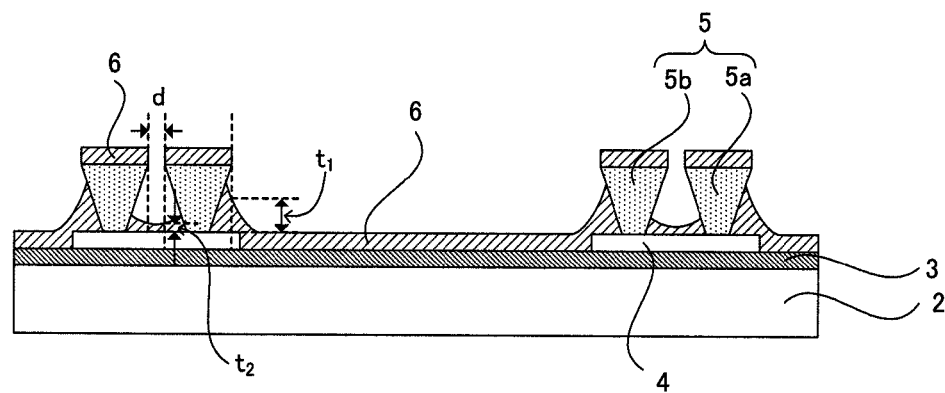
FIG. 7 is a schematic view illustrating other embodiment of the organic layer forming step of the producing method of an organic EL element for the present invention.

As for $t_2$, it is suffice when the height from the substrate surface to the organic layer surface is lower than the height from the substrate surface to the small banks surface and is lower than $t_1$, at the end part of the organic layer at the opposite side to the light emitting region side of the small bank provided on the light emitting region side. In the embodiments shown in FIG. 1B and FIG. 6B, the cases when the relation $t_2 = 0$ are established are illustrated. However, an embodiment may be the case of $t_2 > 0$ as shown in FIG. 7 as long as the relation of $t_1 > t_2$ is established.

Specifically, when the thickness of the small banks is 1, $t_2$ is preferably 0.1 or smaller, more preferably 0.05 or smaller, and even more preferably 0.025 or smaller. This is because, if the ratio is within the above-mentioned range, it is possible to absolutely segment the second electrode layer and to effectively restrain short-out between second electrode layers provided with a bank inbetween.

Further, $t_2$ is preferably within the range of 0 nm to 500 nm, more preferably within the range of 0 nm to 250 nm, and even more preferably within the range of 0 nm to 100 nm. This is because, if $t_2$ is within the above-mentioned range, similar to the above, it is possible to absolutely segment the second electrode layer and to effectively restrain short-out between second electrode layers provided with a bank inbetween.

The kind of $t_1$ is not particularly limited as long as it is higher than $t_2$.

3. Organic EL Layer Forming Step

An organic EL layer forming step of the present invention is a step comprising the above-mentioned organic layer forming step and is to form the organic EL layer.

The organic EL layer comprises one or plural organic layers including at least the light emitting layer, and the layer structure thereof is as explained in the above-mentioned section of the organic layer forming step. In the present invention, it is sufficient as long as at least one organic layer out of organic layers constituting the organic EL layer is formed by either of the printing method, the discharge method, or the transfer method. The other layers constituting the organic EL layer may be formed by a method other than the printing method, the discharge method, and the transfer method. For example, after sequentially forming on the substrate for an organic EL element the hole injecting layer and the light emitting layer by the printing method, the discharge method, or the transfer method, the electron transporting layer and the electron injecting layer can be formed on the light emitting layer by a method such as a vacuum deposition method which is other than the printing method, discharge method, or the transfer method. Further, for example, after forming the hole injecting layer on the substrate for an organic EL element by a method such as a spin coating method which is other than the printing method, the discharge method, and the transfer method, the light emitting layer can be formed on the hole injecting layer by the printing method, the discharge method, or the transfer method.

When a layer constituting the organic EL layer is formed by a method other than the printing method, the discharge method, and the transfer method, a layer constituting the organic EL layer may be formed in between small banks so that there may be the following case arises among the plural small banks constituting the bank: the thickness of this layer at end part of the light emitting region side of the small bank provided on the light emitting region side becomes about the same to the thickness of this layer at the end part of the side opposite to the light emitting region side of the small bank provided on the light emitting region side. However, because one or more organic layers out of the organic layers constituting the organic EL layer is formed by the printing method, the discharge method, or the transfer method in the present invention, the thickness of the organic layer at the end part of the light emitting region side of the small bank provided on the light emitting region side and the thickness of the organic layer and the thickness of the organic layer at the end part of the side opposite to the light emitting region side of the small bank provided on the light emitting region side becomes different, as the thickness of the organic layer. More specifically, the thickness of the organic layer at the end part of the side opposite to the light emitting region side of the small bank provided on the light emitting region side becomes thinner than the thickness of the organic layer at the end part of the light emitting region side of the small bank provided on the light emitting region side. Thus, even if one or more organic layers out of the organic layers constituting the organic EL layer is formed by the printing method, the discharge method, or the transfer method, and other layer(s) constituting the organic EL layer is formed by a method except the printing method, the discharge method, or the transfer method, the effect that the second electrode layer is segmented can be fully and sufficiently obtained.

As explained, at least one organic layer constituting the organic EL layer is formed by the printing method, the discharge method, or the transfer method, and other layer(s) constituting the organic EL layer may be formed by a method other than the printing method, the discharge method, or the transfer method. In particular, out of organic layers constituting the organic EL layer, it is preferable to form all of the organic layer(s), formed by a wet process, to be formed by the printing method, the discharge method, or the transfer method. Thereby, it is possible to further absolutely segment the second electrode layer.

Hereinafter, the other layer(s) formed by a method other than the printing method, discharge method, and transfer method; and the other method other than the printing method, discharge method, and transfer method will be explained in turn.

(1) Other Layer(s) Formed by a Method Other Than the Printing Method, Discharge Method, and Transfer Method In the present invention, the other layer(s) formed by a method other than the printing method, discharge method, and transfer method is preferably a layer other than the light emitting layer. As examples of such a layer, a hole injecting layer, an electron injecting layer, and an electron transporting layer can be cited. Hereinafter, these layers will be explained.

(i) Hole Injecting Layer

The hole transporting layer may sometimes be integrated with the hole injecting layer by providing a hole transporting function to the hole injecting layer. In other words, the hole injecting layer may only have the hole injecting function, or may have both of the hole injecting function and the hole transporting function.

A material used for the hole injecting layer is not particularly limited as long as it can stabilize the injection of the holes into the light emitting layer. Apart from the above-mentioned compounds listed as the light emitting material for the light emitting layer, phenylamines, starburst type amines, phthalocyanins, oxides such as vanadium oxide, molybdenum oxide, ruthenium oxide, aluminum oxide, and titanium oxide, a conductive polymer such as amorphous carbon, polyaniline, polythiophene, and polyphenylenevinylene derivatives can be used. More specifically, substances such as bis(N-(1-naphthyl-N-phenyl)-benzidine (α-NPD), 4,4,4-tris (3-methylphenylphenylamino) triphenylamine (MTDATA), poly(3,4-ethylenedioxithiophene)-polystyrene sulfonate (PEDOT-PSS), and polyvinyl carbazole (PVCz) can be cited.

Further, the thickness of the hole injecting layer is not particularly limited as long as it is a thickness which allows the full exhibition of the hole injecting function and the hole transporting function. Specifically, the thickness is within the range of 0.5 nm to 1,000 nm, and preferably within the range of 10 nm to 500 nm.

(iii) Electron Injecting Layer

The electron transporting layer may sometimes be integrated with the electron injecting layer by providing the electron transporting function to the electron injecting layer. In other words, the electron injecting layer may only have the electron injecting function, or may have both of the electron injecting function and the electron transporting function.

A material used for the electron injecting layer is not particularly limited as long as it can stabilize the injection of electrons into the light emitting layer. Apart from the light emitting materials listed for the light emitting layer, an alkali metal such as aluminum-lithium alloy, lithium fluoride, strontium, magnesia oxide, magnesium fluoride, strontium fluoride, calcium fluoride, barium fluoride, aluminum oxide, strontium oxide, calcium, polymethylmethacrylate, sodium polystyrene sulfonate, lithium, cesium, and cesium fluoride; and halides of alkali metals; and organic complexes of alkali metals can be cited.

Further, a metal doped layer in which an alkali metal or an alkali earth metal is doped in an electron transporting-organic material may be formed, and this layer may be used as the electron injecting layer. As examples of the electron transporting-organic material, bathocuproin, bathophenanthroline, and phenanthroline derivatives phenanthroline can be cited. As examples of the metal doped, Li, Cs, Ba, and Sr can be cited.

A thickness of the electron injecting layer is not particularly limited as long as it is a thickness which allows full exhibition of the electron injecting function and the electron transporting function.

(iv) Electron Transporting Layer

A material used for the electron transporting layer is not particularly limited as long as it is a material which can transport the electrons injected from the cathode into the light emitting layer. For example, bathocuproi, bathophenanthroline, phenanthroline derivatives, triazole derivatives, oxadiazole derivatives, and tris(8-quinolinolato)aluminum ($Alq_3$) can be cited.

A thickness of the electron transporting layer is not particularly limited as long as it is a thickness which allows full exhibition of the electron transporting function.

(2) The Other Method Other Than the Printing Method, Discharge Method, and Transfer Method The other method other than the printing method, discharge method, and transfer method may be a wet method or dry method.

As a wet method, a method of coating a coating solution can be cited. As examples of the coating methods, a dip coating method, a roll coating method, a blade coating method, a spin coating method, a bar coating method, a wire bar coating method, a casting method, and an LB method can be cited.

As a dry method, a common deposition method such as vacuum deposition method can be cited.

4. Second Electrode Layer Forming Step

A second electrode layer forming step of the present invention is a step to form a second electrode layer on the organic EL layer.

The second electrode layer may be an anode or a cathode. Generally, the second electrode layer is formed as a cathode.

Further, the second electrode layer may be or may not be transparent. Transparency of the second electrode layer is appropriately selected depending on factors such as a light-taking out surface. For example, when the light is taken out from the second electrode layer side, the second electrode layer needs to be transparent of translucent.

For the cathode, it is preferable to use a conductive material having a small work function for facilitating the electron injection. For example, magnesium alloys such as MgAg, aluminum alloys such as AlLi, AlCa, and AlMg, alkali metals and alkali earth metals typified by Li and Ca, or alloys of an alkali metal and an alkali earth metal can be cited.

Further, the second electrode layer preferably has low resistance. A metal material is generally used therefore, but an organic compound or an inorganic compound may be used.

In the present process, it is preferable to form the second electrode layer on the organic EL layer by film-forming a metal material. The material for the second electrode layer is not limited as long as it has low resistance and a metal material is most suited therefore.

As a film forming method of the metal material, a general formation method for electrodes can be used. For example, common deposition methods such as a vacuum deposition method, a sputtering method, an ion-plating method, and a method of coating a metal paste can be cited. Among the above, the vacuum deposition method and the method of coating a metal paste is preferable. The vacuum deposition method is a dry process which has small damage to the organic EL layer and therefore, suitable for lamination. Further, a method to coat the metal paste is a wet process and the wet process is more suitable for coating a big area comparing to the dry process. Even if the method is a wet process, a metal paste can be used as long as the metal paste has a solvent blended which does not affect an organic EL layer. In other words, by arranging factors such as the solvent resistance of the organic EL layer to avoid affecting the organic EL layer, a wet process can also become applicable for the film forming method of the metal material.

In case when an insulating layer between a first electrode layer and a bank is not formed, a substrate for an organic EL element 1 illustrated in FIG. 4A is used. When the organic layer 6 and the second electrode layer 7 shown in FIGS. 4B and 4C are formed using such substrate for an organic EL element 1, there may be cases where the first electrode layer 3 and the second electrode layer 7 contact between the small banks 5a and 5b, as shown in FIG. 4C. In the present invention, the second electrode layer 7 provided between the small banks 5a and 5b is segmented from the second electrode layer 7 provided in the light emitting region 11, and thus, the second electrode layer does not engage in the voltage application. Thus, an insulating layer is not formed, and there will be no electric short-out between the first electrode layer and the second electrode layer even if the first electrode layer and the second electrode layer contact in between small banks.

B. Organic EL Element

Next, an organic EL element of the present invention will be explained.

The organic EL element of the present invention comprises: a substrate, a first electrode layer formed on the substrate, plural insulating banks formed on the substrate on which the first electrode layer is formed and setting a segmentalized region which segments a second electrode layer into plural pieces, an organic EL layer formed on the first electrode layer between the banks and including a light emitting layer, and a second electrode layer formed on the organic EL layer and segmentalized by the banks, wherein each of the banks has plural small banks provided in parallel with a predetermined gap; wherein a relation of $t_3 > t_4$ is established, when a height of an end part of the second electrode layer at a side of a light emitting region of the small bank provided on the light emitting region side is $t_3$, and a height of an end part of the second electrode layer at a side opposite to the side of the light emitting region of the small bank provided on the light emitting region side is $t_4$, out of the small banks constituting the banks; and wherein the adjacent second electrode layers sandwiching the bank are electrically-insulated to each other.

An organic EL element of the present invention will be explained with reference to the drawings.

Figure 10:
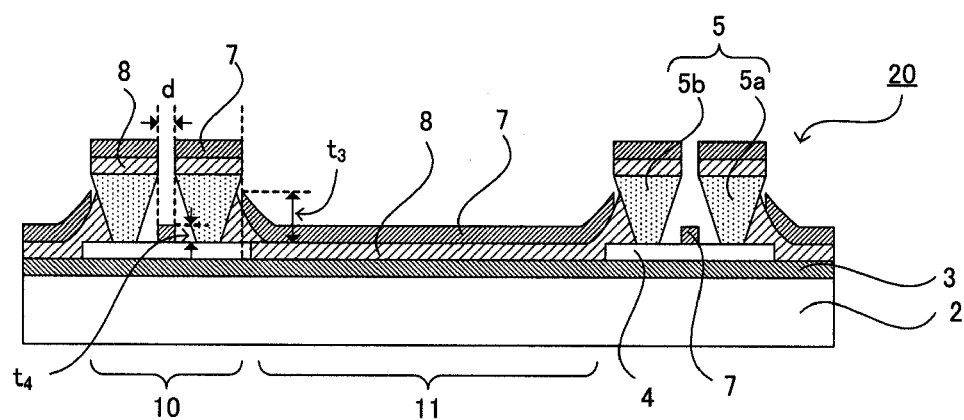
FIG. 10 is a schematic cross-sectional view illustrating one embodiment of the organic EL element of the present invention.

FIG. 10 is a schematic cross-sectional view illustrating one embodiment of the organic EL element of the present invention. The organic EL element 20 shown in FIG. 10 comprises: a substrate 2, a first electrode layer 3 formed on the substrate 2, insulating layer 4 formed on the first electrode layer 3, plural insulating banks 5 formed on the insulating layer 4 and setting a segmentalized region 10 which segments a second electrode layer into plural pieces, a light emitting layer 8 formed on the first electrode layer 3 provided between the banks 5, and the second electrode layer 7 formed on the light emitting layer 8 and segmentalized by the banks 5.

Each of the banks 5 has plural small banks 5a and 5b provided in parallel with a predetermined gap "d". In an embodiment shown in FIG. 10, as shown in FIG. 2, banks 5 (small banks 5a and 5b) is formed such that the striped pattern of the first electrode layer 3 becomes orthogonal to the striped pattern of the banks 5 (small banks 5a and 5b). A relation of $t_3 > t_4$ is established, when a height of the end part of the second electrode layer at the light emitting region 11 side of the small bank 5a or 5b (in FIG. 10, it is 5a) provided on the light emitting region 11 side is $t_3$, and a height of the end part of the second electrode layer at a side opposite to the light emitting region 11 side of the small bank 5a or 5b (in FIG. 10, it is 5a) provided on the light emitting region 11 side is $t_4$, out of the small banks 5a and 5b constituting the banks 5.

Further, the adjacent second electrode layers 7 sandwiching the bank 5 are electrically-insulated to each other.

When producing such organic EL element, as shown in FIG. 1B, the organic layer forming-coating solution sometimes also adhere to the side surface of the light emitting region 11 sides of the respective small banks 5a and 5b at the time of forming an organic layer such as a light emitting layer. As a result, thickness of the organic layer 6 (such as the light emitting layer) around the bank 5 sometimes becomes thick. However, since the gap "d" between the small banks 5a and 5b is relatively narrow, the organic layer forming-coating solution becomes less likely to get in between the small banks 5a and 5b and it becomes possible to reduce the thickness of the organic layer 6 located between the small banks 5a and 5b. Therefore, in the organic EL element 20 illustrated in FIG. 10, the height of the second electrode layer located between the small banks is reduced. That is, the relation of $t_3 > t_4$ is established.

In the present invention, each of the banks has plural small banks provided in parallel with a predetermined gap and the relation of $t_3 > t_4$ is established. Thus, even if the coating solution is adhered to the side surface of the light emitting region side of the small banks and the thickness of the organic layer (such as the light emitting layer) becomes thicker around the bank, it is possible to reduce the thickness of the organic layer (such as the light emitting layer) located between the small banks and to reduce the height of the second electrode layer located between the small banks. Therefore, it is possible to absolutely segment the second electrode layer and to prevent short-out between second electrode layers provided with a bank inbetween.

The respective definitions of the terms "segmentalized region", "light emitting region", "small banks provided on the light emitting region side . . . out of the small banks constituting the banks", "end part . . . at a side of a light emitting region of the small bank provided on the light emitting region side", and "end part . . . at a side opposite to the side of the light emitting region of the small bank provided on the light emitting region side" are explained in the above-mentioned section of "A. Producing Method of Organic EL Element". Thus, explanations here are omitted.

Figure 11:
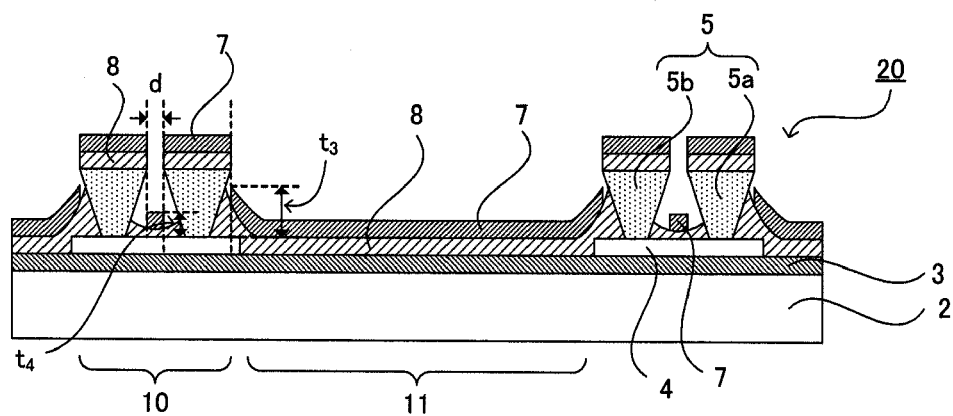
FIG. 11 is a schematic cross-sectional view illustrating other embodiment of the organic EL element of the present invention.
Figure 12:
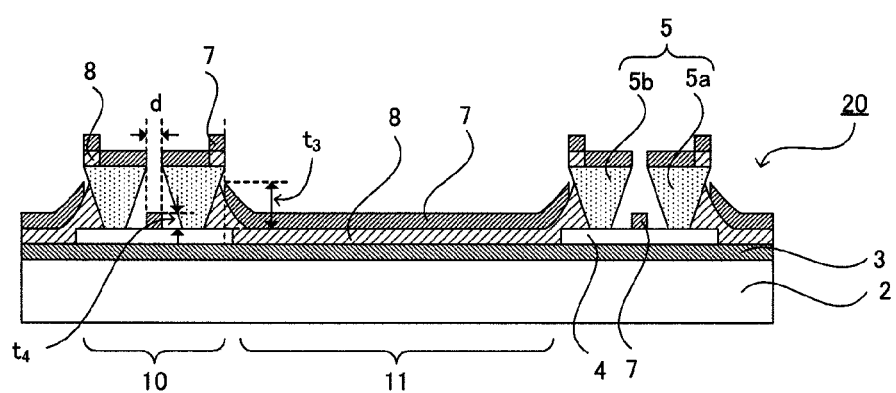
FIG. 12 is a schematic cross-sectional view illustrating still other embodiment of the organic EL element of the present invention.
Figure 13:
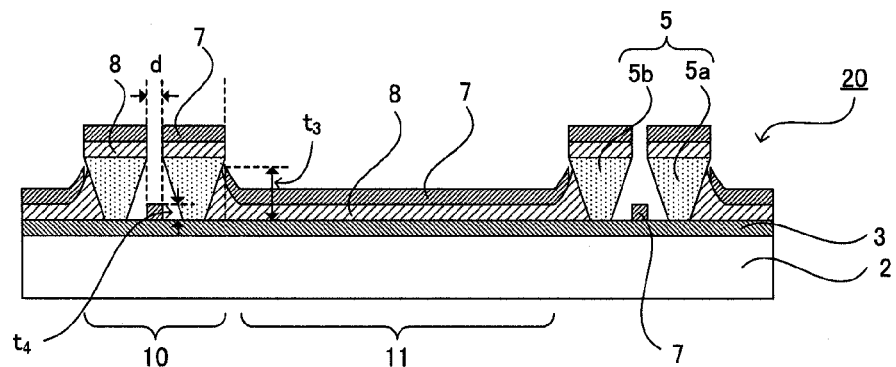
FIG. 13 is a schematic cross-sectional view illustrating yet other embodiment of the organic EL element of the present invention.

The expression "height of an end part of the second electrode layer at the light emitting region side of the small bank provided on the light emitting region side is $t_3$" denotes a height from the under layer surface of the small banks to the second electrode layer surface, and the height of the light emitting region side end part of the small bank which is provided to the light emitting region side. As shown in FIGS. 10 to 12, when the small banks 5a and 5b are formed directly on the insulating layer 4, the under layer of the small banks 5a and 5b is the insulating layer 4, and the height $t_3$ of the second electrode layer is a height between the insulating layer 4 surface to the second electrode layer 7 surface at the end part of the light emitting region 11 side of the small bank 5a. Further, as shown in FIG. 13, when the small banks 5a and 5b are directly formed on the first electrode layer 3, the under layer of the small banks 5a and 5b is the first electrode layer 3, and the height $t_3$ of the second electrode layer is a height between the first electrode layer 3 surface to the second electrode layer 7 surface at the end part of the light emitting region 11 side of the small bank 5a.

Further, the expression "height of an end part of the second electrode layer at a side opposite to the light emitting region side of the small bank provided on the light emitting region side is $t_4$" denotes a height of the small bank from the under layer surface to the second electrode layer surface at the end part of the small bank, provided on the light emitting region, and the end part is located at a side opposite to the light emitting region side. As shown in FIGS. 10 to 12, when the small banks 5a and 5b are formed directly on the insulating layer 4, the under layer of the small banks 5a and 5b is the insulating layer 4, the height $t_4$ of the second electrode layer is the height of the end part of the small bank 5a which is opposite to the light emitting region 11 side, and the height $t_4$ is the height from the insulating layer 4 surface to the second electrode layer 7 surface. Still further, as shown in FIG. 13, when the small banks 5a and 5b are formed directly on the first electrode layer 3, the under layer of the small banks 5a and 5b is the first electrode layer 3, the height $t_4$ of the second electrode layer is the height of the end part of the small bank 5a which is opposite to the light emitting region 11 side, and the height $t_4$ is the height from the first electrode layer 3 surface to the second electrode layer 7 surface.

The measurement method of the height $t_3$ and $t_4$ of the second electrode layer are the same to the measurement method of the height $t_1$ and $t_2$ of the organic layer explained in the above-mentioned section of "A. Producing Method of Organic EL Element". Thus, explanations here are omitted.

Moreover, the substrate, first electrode layer, bank, segmentalized region, and insulating layer are specifically explained in the above-mentioned section of "Substrate for Organic EL Element Preparing Step" of "A. Producing Method of Organic EL Element". Thus, explanations here are omitted. Hereinafter, other technical structures of the organic EL element of the present invention will be explained.

1. Second Electrode Layer

In the present invention, the relation of $t_3 > t_4$ is established, when the height of an end part of the second electrode layer at the light emitting region side of the small bank provided on the light emitting region side is $t_3$, and the height of an end part of the second electrode layer at a side opposite to the light emitting region side of the small bank provided on the light emitting region side is $t_4$, out of the small banks constituting the banks.

As for $t_4$, it is sufficient if the height from the substrate surface to the second electrode layer surface at the end part of the side opposite to the light emitting region side of the small bank provided on the light emitting region side is lower than the height from the substrate surface to the small bank surface and is also lower than $t_3$. Specifically, $t_4$ is preferably 0.5 or lower when the thickness of the small banks is 1, more preferably 0.25 or lower, and even more preferably 0.1 or lower. This is because, when the ratio is within the above-mentioned range, the second electrode layer is absolutely segmented and it is possible to effectively restrain the short-out between second electrode layers provided with a bank inbetween. More specifically, $t_4$ is preferably within the range of 50 nm to 2000 nm, more preferably within the range of 50 nm to nm, and even more preferably within the range of 50 nm to 400 nm. This is because, when $t_4$ is within the above-mentioned range, similar to the above, it is possible to absolutely segment the second electrode layer and to effectively restrain the short-out between second electrode layers provided with a bank inbetween.

The kind of $t_3$ is not particularly restricted as long as it is higher than $t_4$.

Further, the adjacent second electrode layers sandwiching the bank are electrically-insulated to each other. Whether or not the adjacent second electrode layers sandwiching the bank are electrically-insulated to each other can be confirmed by the conduction checked by running a tester or by light emission caused by voltage application.

Other factors regarding the second electrode layer are explained in the above-mentioned section of "Second Electrode Layer Forming Step" of the "A. Producing Method of Organic EL Element". Thus, explanations here are omitted.

2. Organic EL Layer

An organic EL layer used in the present invention comprises one or plural numbers of organic layers which include at least the light emitting layer.

Layer structure of the organic EL layer and each layer constituting the same are explained in the above-mentioned section of "Organic Layer Forming Step" and "Organic EL Layer Forming Step" of the "A. Producing Method of Organic EL Element". Thus, explanations here are omitted.

At least one organic layer out of organic layers constituting the organic EL layer may have a meniscus cross-sectional shape. For example, in FIGS. 10 to 13, the respective light emitting layer 8 located between two adjacent banks 5 has the meniscus cross-sectional shape. When an organic layer (such as the light emitting layer) constituting the organic EL layer has a meniscus cross-sectional shape, there is a risk of the second electrode layer formed on the organic EL layer getting connected between the light emitting region and the segmentalized region. However, because each bank is constituted from plural small banks in the present invention, it becomes possible to absolutely segment the second electrode layer. Therefore, when at least one organic layer out of organic layers constituting the organic EL layer has a meniscus cross-sectional shape, by the technical structure of the present invention, it is possible to effectively prevent short-out between second electrode layers provided with a bank inbetween.

Whether or not the organic layer constituting the organic EL layer has a meniscus cross-sectional shape can be confirmed by observing the cross section electron micrograph of the organic EL element.

The number of the organic layer which has a meniscus cross-sectional shape is not limited as long as it is more than one layer. For example, the organic layer may be one layer, two layers, or three layers.

Further, the organic layer which has a meniscus cross-sectional shape is preferably a light emitting layer. This organic layer may be a hole injecting layer and light emitting layer.

A forming position of the organic EL layer is not limited as long as each layer constituting the organic EL layer is formed at least in the light emitting region. For example, the light emitting layer 8 may be formed on the bank 5 as shown in FIGS. 10 to 13, or may not be formed on the bank (not illustrated) When the light emitting layer is formed on the bank, the light emitting layer 8 may be formed on the entire bank 5 as shown in FIGS. 10, 11 and 13, or the light emitting layer 8 may be formed on a part of the bank 5 as shown in FIG. 12.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be specifically explained with reference to examples and comparative examples.

Example 1

(Formation of Transparent Electrode)

First, an indium tin oxide (ITO) electrode film of 200 nm film thickness was formed by an ion plating method on a glass substrate (thickness of 0.7 mm). A photo sensitive resist was then coated on the ITO electrode film, and a mask exposure, development, and an etching of the ITO electrode film were carried out to form 30 transparent electrode layers, each of which has 1.7 mm width, in stripe form of 2.3 mm pitch.

(Formation of Insulating Layer)

Next, the glass substrate (thickness of 0.7 mm) was washing treated, UV plasma washed, and then coated with a positive type photo sensitive resist having a polyimide precursor as the main component by a spin coating method. The resultant was patterned by a photolithography process and an insulating layer (thickness of 1.5 µm) was formed so as a light emitting area (opening part) of 1.5 mm×1.5 mm size was formed on each of the transparent electrode layers by 2.3 mm pitch.

(Formation of Bank)

Further next, the glass substrate with the insulating layer formed was washing treated, UV plasma washed, and then coated by a spin coating method with a negative type photo sensitive resist made of a novolac resin, a phenol resin, a melamine resin. The resultant was patterned by a photolithography process, and banks in stripe form and having an inverse tapered shape cross-section were formed in parallel so as the banks became orthogonal to the transparent electrode layer on the insulating layer. At this time, the number of the small banks constituting the bank was 2 (2 lines). Further, the gaps between small banks were changed to 60 µm, 30 µm, and 15 µm to form the bank. The small banks had a width of 50 µm, a thickness of 4 µm, and an angle of inverse taper was 50°.

(Preparations of Inks for Hole Injecting Layer and Red Light Emitting Layer)

Next, an ink for hole injecting layer A1 of the following composition was prepared. The viscosity (ink temperature 23° C.) at shear velocity 100/Second of the ink A1 was measured with the viscoelasticity measuring instrument MCR301™ manufactured by Physica Corporation at steady flow measurement mode, and it was 15 cP. Further, the dynamic surface tension (ink temperature 23° C.) at 2 Hz was measured by SITA t60/2 (manufactured by SITA Messtechnik GmbH), and it was 30 dyne/cm.

| <Composition of Ink for Hole Injecting Layer A1> | |
|---|---|
| PEDOT (poly (3,4) ethylenedioxythiophene)/PSS (polystyrenesulfonate) (mixing ratio = 1/20) (Baytron PCH8000 ™ manufactured by Bayer AG) | 70% by weight |
| Mixed solvent (water:isopropyl alcohol (boiling point 82.4° C.) = 70:30) | 30% by weight |

Further next, an ink for red light emitting layer B1 of the following composition was prepared. The viscosity (ink temperature 23° C.) at shear velocity 100/Second of the ink B1 was measured in the same manner as in the ink A1, and it was 80 cP. Further, surface tensions of mesitylene and tetralin used as solvents were measured at solution temperature 20° C. by a surface tensiometer CBVP-Z™ manufactured by Kyowa Interface Science Co., Ltd.

| <Composition of Ink for Red Light Emitting Layer B1> | |
| --- | --- |
| Polyfluorene derivatives-based red light emitting material (molecular weight: 300,000) | 2.5% by weight |
| Solvent(mixed solvent of mesitylene:tetralin = 50:50) (surface tension of the mixed solvent = 32 dyne/cm, boiling point = 186° C.) (surface tension of mesitylene = 28 dyne/cm, boiling point = 165° C.) (surface tension of tetralin = 35.5 dyne/cm, boiling point = 207° C.) | 97.5% by weight |

(Formation of Hole Injecting Layer and Light Emitting Layer)

As a gravure plate, a gravure plate in plate form (working width 80 mm) having square cells (each side of a cell is 100 µm, and depth of the cell is 35 µm) aligned in grating with the cell gap of 25 µm was prepared. In this gravure plate, the direction of the diagonal line of the square cell was made identical to the driving direction of the blanket to be explained later.

Next, as a resin film, adhesive polyethyleneterephthalate (PET) film (manufactured by Toray Industries, Inc., U10™, thickness of 100 µm, surface tension 60 dyne/cm) was prepared. The surface tension of this film was obtained by using at least two liquids whose surface tensions are known (reference material), measuring their contact angles θ with an automatic contact angle measuring device (DropMaster 700 type manufactured by Kyowa Interface Science Co., Ltd.), and using a formula: γs (surface tension of resin film)=γL (surface tension of a liquid) cos θ+γSL (surface tensions of the resin film and the liquid).

Further next, a blanket was produced by attaching the above-mentioned resin film around a blanket body having a body width of 30 cm (provided with a cushion layer (hardness 70°) on its surface) and a diameter of 12 cm. The hardness of the cushion layer is the Type A hardness measured by JIS (K6253) durometer hardness test.

Then, the gravure plate and the blanket were set on the flatbed off-set press, the above-mentioned ink for hole injecting layer A1 was supplied to the gravure plate, unnecessary amount of the ink was removed with a blade, and the ink was filled in the cells. The ink was subsequently received from the gravure plate to the blanket. Afterwards, by transferring the ink from the blanket to the above-mentioned glass substrate with banks and the like are formed, a hole injecting layer (thickness of about 70 nm) was formed. Conditions were as follows: printing speed of 1,000 mm/second, and one hour of drying on a hot plate set at 120° C. The size of the hole injecting layer was 80 mm×80 mm and it was formed so as to cover the opening parts of the insulating layer.

Next, the ink for red light emitting layer B1 was supplied to the gravure plate, and a red light emitting layer (thickness of about 70 nm) was formed in a similar manner to the formation of the hole injecting layer. Conditions were as follows: printing speed of 1,000 mm/second, and one hour of drying on a hot plate set at 180° C. The size of the red light emitting layer was 80 mm×80 mm and it was formed so as to cover the hole injecting layer.

At this time, the respective heights at the end part of the hole injecting layer and the light emitting layer at the light emitting region side of the small banks (the height $t_1$ of the hole injecting layer and the light emitting layer), and the respective heights of the hole injecting layer and the light emitting layer at the side opposite to the light emitting region side of the small banks (the height $t_2$ of the hole injecting layer and the light emitting layer) were measured by the Scanning White Light Interferometry manufactured by Zygo Corporation.

(Formation of Electron Injecting Layer)

A metal mask having opening parts of 90 mm×90 mm size is provided on the surface, where the red light emitting layer was formed, in such a manner that the metal mask was positioned on the light emitting area (opening part) of the insulating layer. Next, calcium was deposited (deposition speed=0.1 nm/second) via this mask by a vacuum deposition method to form an electron injecting layer (thickness of 10 nm).

(Formation of Second Electrode Layer)

Next, using the metal mask used for the formation of the electron injecting layer, aluminum was deposited (deposition speed=0.4 nm/second) by a vacuum deposition method. Thereby, a second electrode layer (thickness of 4 µm) made of aluminum and having opening parts of 90 mm×90 mm size was formed on the electron injecting layer.

Lastly, a sealing plate was attached via a UV cure adhesive to the side where the second electrode layer was formed, and an organic EL element was obtained.

Comparative Example 1

An organic EL element was produced in the same manner as in Example 1 except that a bank was formed in the following manner.

(Formation of Bank)

Figure 14A:
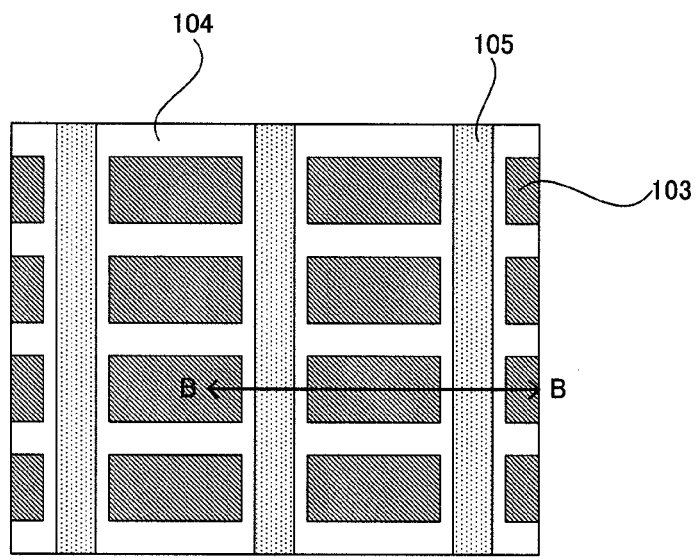
FIGS. 14A and 14B are each a schematic cross-sectional view illustrating one embodiment of a conventional organic EL element.
Figure 14B:
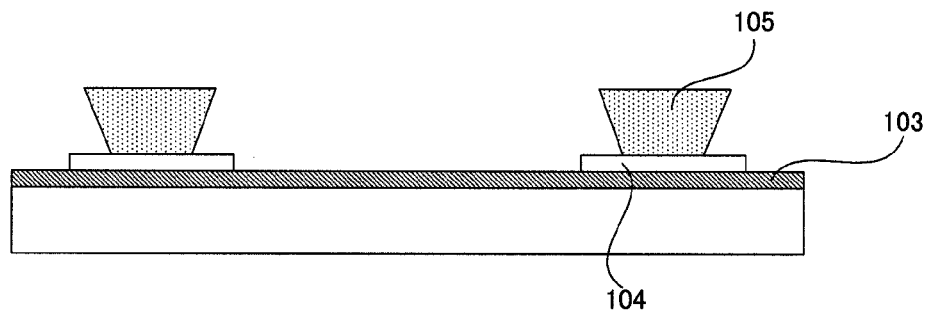

The glass substrate with the insulating layer formed was washing treated, UV plasma washed, and then coated by a spin coating method with a negative type photo sensitive resist made of a novolac resin, a phenol resin, a melamine resin. The resultant was patterned by a photolithography process, and banks 105 in stripe form were formed in parallel so as the banks became orthogonal to the transparent electrode layer 103 on the insulating layer 104 as shown in FIGS. 14A and 14B. At this time, the bank 105 was only 1 line. Further, bank had a width of 50 µm, a thickness of 4 µm. Moreover, FIG. 14A is a top view, and FIG. 14B is a cross-sectional view of the B-B cross-sectional line shown in FIG. 14A.

Comparative Example 2

An organic EL element was produced in the same manner as in Example 1 except that a hole injecting layer and a light emitting layer were formed in the following manner.

(Preparations of Inks for Hole Injecting Layer and Red Light Emitting Layer)

An ink for hole injecting layer of the following composition was prepared.

<Composition of Ink for Hole Injecting Layer>

PEDOT (poly(3,4)ethylenedioxythiophene)/PSS (polystyrenesulfonate) (mixing ratio=1/20) (Baytron PCH8000™ manufactured by Bayer A G)

Further, ink for red light emitting layer of the following composition was prepared.

| <Composition of ink for red light emitting layer> | |
| --- | --- |
| Polyfluorene derivatives-based red light emitting material (molecular weight: 300,000) | 1.5% by weight |
| Solvent (xylene) | 98.5% by weight |

(Formation of Hole Injecting Layer and Light Emitting Layer)

Using a spin coater, a hole injecting layer (thickness of about 70 nm) was formed. Conditions were as follows: rotation speed was 3000 rpm, and one hour of drying on a hot plate set at 120° C. At this time, a hole injecting layer was formed to cover the opening parts of the insulating layer.

Next, using a spin coater, a light emitting layer (thickness of about 70 nm) was formed. Conditions were as follows: rotation speed was 1500 rpm, and one hour of drying on a hot plate set at 180° C. At this time, a light emitting layer was formed to cover the hole injecting layer.

[Evaluation]

The segmentation rate regarding Example 1 and Comparative Examples 1 and 2 were obtained as follows. The segmentation rate denotes the segmented status of the second electrode layer. The rate of no short-out between the adjacent second electrode layers sandwiching the bank is described as the segmentation rate. The segmentation rate was measured as follows. A voltage was applied to each line of the second electrode layer. When the selected position (selected line) and the non-selected position next to the selected position (non-selected line next to the selected line) emitted light by the voltage application, it was considered that short-out was occurred between the second electrode layers. This was regarded as one defect. All gaps between each second electrode layers were detected and thereby, the segmentation rate was calculated.

Table 1 below shows the results of Example 1 and Comparative Examples 1 and 2.

Example 2

An organic EL element was produced in the same manner as in Example 1 except that gaps between small banks were 30 μm in forming banks and that the second electrode layer was formed in the following manner.

(Formation of Second Electrode Layer)

Using the metal mask used for the formation of the electron injecting layer, aluminum was deposited (deposition speed=0.4 nm/second) by a vacuum deposition method. Thereby, a second electrode layer (thickness of 300μm) made of aluminum and having opening parts of 90 mm×90 mm size was formed on the electron injecting layer.

At this time, the height at the end part of the second electrode layer at the light emitting region side of the small banks (the height $t_3$ of the second electrode layer), and the height of the second electrode layer at the side opposite to the light emitting region side of the small banks (the height $t_4$ of the second electrode layer) were measured by the laser microscope manufactured by KEYENCE CORPORATION.

The height $t_3$ of the second electrode layer was 700 nm, and the height $t_4$ of the second electrode layer was 580 nm.

Example 3

An organic EL element was produced in the same manner as in Example 1 except that gaps between small banks were 30 μm in forming banks and that the hole injecting layer, the light emitting layer, and the second electrode layer were formed in the following manner.

TABLE 1

| | Number of Small Banks Constituting Bank (Unit) | Gap between Small Banks (μm) | Thickness of Second Electrode Layer (nm) | Height $t_1$ of Hole Injecting Layer and Light Emitting Layer (nm) | Height $t_2$ of Hole Injecting Layer and Light Emitting Layer (nm) | Segmentation Rate (%) |
|---|---|---|---|---|---|---|
| Example 1-1 | 2 | 60 | 4000 | 406 | 336 | 79 |
| Example 1-2 | 2 | 30 | 4000 | 402 | 327 | 86 |
| Example 1-3 | 2 | 15 | 4000 | 410 | 270 | 97 |
| Comparative Example 1 | 1 | — | 4000 | 400 | 409 | 17 |
| Comparative Example 1 | 2 | 30 | 4000 | 460 | 470 | 14 |

Height $t_1$ of Hole Injecting Layer and Light Emitting Layer . . . Heights of the hole injecting layer end part and the light emitting layer end part at the light emitting region side of the small bank provided on the light emitting region side Height $t_2$ of Hole Injecting Layer and Light Emitting Layer . . . Heights of the hole injecting layer end part and the light emitting layer end part at a side opposite to the light emitting region side of the small bank provided on the light emitting region side When the number of the small banks formed in Comparative Example 1 was 1 line, the segmentation rate of the second electrode layer was substantially dropped. On the contrary, when the number of the small banks formed in Example 1 was 2 lines, the segmentation rate was higher than the case of 1 line in the Comparative Example 1. Further, it was confirmed that the segmentation rate increased as the gap between small banks narrowed.

Moreover, in case of the spin coating method in the Comparative Example 2, the segmentation rate of the second electrode layer was substantially dropped. It was confirmed that the spin coating method did not fall into the categories of the printing method, discharge method, and the transfer method, so that it is not suitable for the present invention.

At the time of forming the bank, the bank was formed in frame shape at the outer edge of the substrate so as the bank joined to the end part of the shorter side of the bank. This is to avoid effuse of the ink landed to the substrate at time of forming the hole injecting layer and the light emitting layer to be explained later. This bank in frame shape was formed outside of the electrode segmented region.

(Formation of Hole Injecting Layer and Light Emitting Layer)

Using the microdrop system manufactured by microdrop Technologies GmbH (dispenser head MD-K-140™), the ink for hole injecting layer A1 used in Example 1 was discharged between banks. At this time, the landed ink was maintained at the height of the bank. Further, at this time, the ink was heated by a heater of the dispenser head and discharged, and the coating direction was in parallel to the longitudinal direction of the bank. The discharged ink was naturally dried and further dried for 1 hour on a hot plate set at 120° C. Thereby, a hole injecting layer (thickness of about 70 nm) was formed. This hole injecting layer was formed in line in the 80 mm×80 mm region, and was formed so as to cover the opening parts of the insulating layer.

Next, using the microdrop system manufactured by microdrop Technologies GmbH (dispenser head MD-K-140™), the ink for red light emitting layer B1 used in Example 1 was discharged between banks. At this time, the landed ink was maintained at the height of the bank. Further, at this time, the ink was heated by a heater of the dispenser head and discharged, and the coating direction was in parallel to the longitudinal direction of the bank. The discharged ink was naturally dried and further dried for 1 hour on a hot plate set at 180° C. Thereby, a red light emitting layer (thickness of about 70 nm) was formed. This red light emitting layer was formed in line in the 80 mm×80 mm region, and was formed so as to cover the hole injecting layer.

(Formation of Second Electrode Layer)

Next, using the metal mask used for the formation of the electron injecting layer, aluminum was deposited (deposition speed=0.4 nm/second) by a vacuum deposition method. Thereby, a second electrode layer (thickness of 300 μm) made of aluminum and having opening parts of 90 mm×90 mm size was formed on the electron injecting layer.

At this time, the height at the end part of the second electrode layer at the light emitting region side of the small banks (the height $t_3$ of the second electrode layer), and the height of the second electrode layer at the side opposite to the light emitting region side of the small banks (the height $t_4$ of the second electrode layer) were measured by the laser microscope manufactured by KEYENCE CORPORATION.

The height $t_3$ of the second electrode layer was 700 nm, and the height $t_4$ of the second electrode layer was 300 nm.

What is claimed is:

1. A producing method of an organic electroluminescence element comprising steps of:
    an organic layer forming step, in which at least one organic layer out of organic layers, including a light emitting layer, constituting an organic electroluminescence layer is formed by either of a printing method, a discharge method, or a transfer method on a substrate for an organic electroluminescence element,
    wherein the substrate for an organic electroluminescence element comprises a substrate, a first electrode layer formed on the substrate, plural insulating banks formed on the substrate on which the first electrode layer is formed and setting a segmentalized region which segments a second electrode layer into plural pieces, and
    wherein each of the banks has plural small banks provided in parallel with a predetermined gap; and
    a step of controlling a gap between the small banks to establish a relation of $t_1 > t_2$, when a height of an end part of the organic layer at a side of a light emitting region of the small bank provided on the light emitting region side is $t_1$, and a height of an end part of the organic layer at a side opposite to the side of the light emitting region of the small bank provided on the light emitting region side is $t_2$, out of the small banks constituting the banks.

2. The producing method of an organic electroluminescence element according to claim 1 further comprising a second electrode layer forming step subsequent to the organic layer forming step, wherein the second electrode layer is formed on the organic electroluminescence layer by film-forming a metal material.

3. The producing method of an organic electroluminescence element according to claim 2, wherein the film-forming method of the metal material is a vacuum deposition method.

4. The producing method of an organic electroluminescence element according to claim 2, wherein a metal paste is used as the metal material.

5. An organic electroluminescence element comprising:
    a substrate,
    a first electrode layer formed on the substrate,
    plural insulating banks formed on the substrate on which the first electrode layer is formed and setting a segmentalized region which segments a second electrode layer into plural pieces,
    an organic electroluminescence layer formed on the first electrode layer between the banks and including a light emitting layer, and
    a second electrode layer formed on the organic electroluminescence layer and segmentalized by the banks,
    wherein each of the banks has plural small banks provided in parallel with a predetermined gap;
    wherein a relation of $t_3 > t_4$ is established, when a height of an end part of the second electrode layer at a side of a light emitting region of the small bank provided on the light emitting region side is $t_3$, and a height of an end part of the second electrode layer at a side opposite to the side of the light emitting region of the small bank provided on the light emitting region side is $t_4$, out of the small banks constituting the banks; and
    wherein the adjacent second electrode layers sandwiching the bank are electrically-insulated to each other.

6. The organic electroluminescence element according to claim 5, wherein an insulating layer is formed between the first electrode layer and the bank.

7. The organic electroluminescence element according to claim 5, wherein at least one organic layer out of organic layers constituting the organic electroluminescence layer has a meniscus cross-sectional shape.

8. The organic electroluminescence element according to claim 6, wherein at least one organic layer out of organic layers constituting the organic electroluminescence layer has a meniscus cross-sectional shape.

* * * * *